(12) United States Patent
Jung

(10) Patent No.: US 11,460,357 B2
(45) Date of Patent: *Oct. 4, 2022

(54) ELECTRONIC DEVICE INCLUDING POWER-ON BUTTON AND INDUCTIVE TOUCH FORCE SENSOR

(71) Applicant: DAMOATECH CO., LTD., Seongnam-si (KR)

(72) Inventor: Hu Min Jung, Seongnam-si (KR)

(73) Assignee: Damoatech Co., Ltd., Seongnam-si (KR)

( * ) Notice: Subject to any disclaimer, the term of this patent is extended or adjusted under 35 U.S.C. 154(b) by 194 days.

This patent is subject to a terminal disclaimer.

(21) Appl. No.: 16/850,612

(22) Filed: Apr. 16, 2020

(65) Prior Publication Data
US 2020/0400513 A1 Dec. 24, 2020

(30) Foreign Application Priority Data

Jun. 24, 2019 (KR) .......................... 10-2019-0075161
Jul. 18, 2019 (KR) .......................... 10-2019-0087132

(51) Int. Cl.
*G01L 1/12* (2006.01)
*G06F 3/041* (2006.01)
*G06F 3/0488* (2022.01)

(52) U.S. Cl.
CPC .......... *G01L 1/127* (2013.01); *G06F 3/04144* (2019.05); *G06F 3/0488* (2013.01)

(58) Field of Classification Search
None
See application file for complete search history.

(56) References Cited

U.S. PATENT DOCUMENTS

| 8,408,723 | B2 | 4/2013 | Porter et al. | |
|---|---|---|---|---|
| 2011/0050626 | A1* | 3/2011 | Porter | H03K 17/952 345/174 |
| 2016/0254500 | A1* | 9/2016 | Kawata | H01M 50/24 362/157 |
| 2017/0016255 | A1 | 1/2017 | Guibbert et al. | |
| 2017/0269754 | A1* | 9/2017 | Liu | G06F 3/0416 |
| 2018/0129324 | A1* | 5/2018 | Soh | G06F 3/046 |
| 2018/0180450 | A1 | 6/2018 | Liu | |
| 2020/0047712 | A1* | 2/2020 | Spick | H04B 5/0081 |

FOREIGN PATENT DOCUMENTS

| JP | 2007-059074 A | 3/2007 |
|---|---|---|
| KR | 10-2010-0039012 A | 4/2010 |
| KR | 10-1147607 B1 | 5/2012 |

(Continued)

*Primary Examiner* — Kirk W Hermann
(74) *Attorney, Agent, or Firm* — United One Law Group LLC; Kongsik Kim; Jhongwoo Peck

(57) ABSTRACT

An inductive force sensor includes a reference resonance circuit, a first resonance circuit, and a determination circuit configured to obtain information about a first resonant frequency, attributable to first inductance due to an inductive coil based on the displacement between a target and the inductive coil formed by an external force input in a Z-axis direction, and a reference resonant frequency. The determination circuit determines the displacement of the target and the external force in the Z-axis direction based on the first resonant frequency and the reference resonant frequency.

21 Claims, 13 Drawing Sheets

(56) References Cited

FOREIGN PATENT DOCUMENTS

| KR | 10-2017-0007127 A | 1/2017 |
| KR | 101697975 B1 * | 1/2017 |
| KR | 101697975 B1 | 1/2017 |
| KR | 10-2018-0084484 A | 7/2018 |
| KR | 101920440 B1 | 11/2018 |
| KR | 101954368 B1 * | 3/2019 |
| KR | 101954368 B1 | 3/2019 |

* cited by examiner

ELECTRONIC DEVICE INCLUDING POWER-ON BUTTON AND INDUCTIVE TOUCH FORCE SENSOR

CROSS-REFERENCE TO RELATED APPLICATION

This application claims under 35 U.S.C. § 119(a) the priority to Korean Patent Application Nos. KR 10-2019-0075161 filed on Jun. 24, 2019 and KR 10-2019-0087132 filed on Jul. 18, 2019, respectively, which are incorporated herein by reference in their entirety.

TECHNICAL FIELD

The present invention relates generally to an electronic device including an inductive touch force sensor, and more particularly to an electronic device including an inductive touch force sensor configured to sense the level of applied force using inductance varying depending on a change in the distance between a target layer and a coil, formed on a printed circuit board (PCB) or a flexible PCB (FBCB) or formed as a transparent electrode, that is caused by an external force and further including a power-on button configured to selectively turning on/off the power that is used to operate the electronic device.

RELATED ART

Recently, touch recognition technology has developed rapidly. In greater detail, touch recognition technology has evolved from two-dimensional (2D) touch recognition technology designed to recognize a touch location using coordinates on X and Y axes into three-dimensional (3D) touch recognition technology designed to sense the strength of a touch (the magnitude of a force applied in a Z-axis direction) rather than simply sensing whether or not there is a touch and thus enrich a user interface.

APPLE Inc.'s 3D Touch has introduced technology that combines a touch sensor and a pressure sensor and differentiates and recognizes the strength of a touch. However, the method of combining a touch sensor and a pressure sensor with each other increases hardware manufacturing cost, and the sensitivity of the pressure sensor is not high, thereby making it difficult to accurately recognize the strength of a touch of a user.

U.S. Patent Application Publication No. US 2017/0269754 filed by Texas Instruments Inc. and entitled "Dual Touch Sensor Architecture With XY-Position And Z-Force Sensing For Touch-On-Surface Button" discloses related art configured to combine a capacitive touch sensor and an inductive sensor, to recognize the presence of a touch and the location of the touch on an X-Y plane using the capacitive touch sensor, and to detect a touch force in a Z-axis direction at the location of the touch using the inductive sensor.

U.S. Patent Application Publication No. US 2018/0180450 filed by Texas Instruments Inc. and entitled "Inductive Touch Input" discloses related art configured to using a plurality of inductive touch sensors, sense whether or not there is a touch and a touch force at each of different locations and recognize a touch scroll gesture by recognizing whether or not there is a touch and the pattern of the movement of the touch force.

Related art documents disclosing technology of sensing a user's intention to lock or unlock a vehicle door by sensing a force applied to the car door using 3D touch force recognition technology include Korean Patent Application Publication No. 10-2017-0007127 and U.S. Patent Application Publication No. US 2017/0016255 entitled "Device for Detecting a User's Intention to Lock or Unlock a Motor Vehicle Door." Related art documents disclosing technology of implementing an inductive touch force sensor by implementing coils on an FPCB include Korean Patent No. 10-1920440 entitled "Self-Inductive Force Sensor Module for 3D Touch Implementation" and Korean Patent No. 10-1954368 entitled "Mutual Inductive Force Sensor Module for 3D Touch Implementation."

The related art documents regarding the sensing of touch force using an inductive sensor introduce technology of recognizing touch force through the arrangement of parts and elements or the selection of a new material or part such as an FPCB. However, when only an inductive sensor is used, the precision with which a touch location and a touch force are sensed is low. In contrast, when an inductive sensor is combined with another sensor, a problem arises in that hardware cost increases.

Furthermore, with the recent popularization of mobile and smart devices, there are various needs for user interfaces and user experiences. In order to fulfill these needs, there is required technology of recognizing a touch force for each minute area. For this purpose, touch sensors/touch force sensors need to be densely arranged, and also there is required technology for the separate recognition of the individual sensors. However, it is difficult for the above-described related arts to satisfy these demands.

SUMMARY

The related arts are configured to improve the sensitivity of a sensor through the arrangement of parts and elements or the selection of a part or material, to combine an inductive sensor and another sensor with each other and separately sense a touch force and a touch location using the respective sensors, or to recognize user gesture patterns by implementing a plurality of inductive sensors and then tracking the sensing information of the inductive sensors.

Furthermore, the related arts are configured to scan the magnitude of an output electric signal formed in a resonance circuit in response to an input electric signal by varying the frequency of the input electric signal applied to the resonance circuit and calculate a frequency having maximum magnitude as a resonant frequency. Accordingly, the related arts have problems in that error corresponding to the resolution of the varied frequency of an input electric signal occurs, accuracy is reduced by the indirect method of calculating a resonant frequency by sensing the magnitude of an electric signal, and measurement requires a considerable amount of time because it is necessary to vary the frequency of an input electric signal.

Moreover, it is difficult for the related arts to perform precise measurement because they sense the magnitude of an electric signal and then calculate a resonant frequency and inductance. As a result, the related arts mainly determine whether or not change in inductance exceeds a certain threshold value, and do not provide accuracy sufficient to quantitatively analyze the change in inductance.

The present invention has been conceived to overcome the above-described problems of the related arts, and an object of the present invention is to provide an inductive touch force sensor and method of operating the same that may reduce hardware cost because only the inductive touch sensor is used and that may accurately detect a touch location and a touch force even when only the inductive touch sensor is used.

Furthermore, an object of the present invention is to provide an inductive touch force sensor and method of operating the same that may sense a change in inductance using only a single measurement without a scanning or sweeping in frequency or the input of a different frequency component, so that a touch location and a touch force may be rapidly detected even in the case of a multi-channel inductive touch force sensor and the intention of a user may be recognized, and to also provide a method of operating the same.

An object of the present invention is to provide an inductive touch force sensor and method of operating the same that may use only the inductive touch sensor itself but does not require, so that power consumption required for the detection of a touch location and a touch force and power consumption may be considerably reduced in the case of a multi-channel inductive touch force sensor.

An inductive touch force sensor according to the present invention is intended to propose a circuit and method of operating the same that may effectively detect a resonant frequency shift. Furthermore, the inductive touch force sensor according to the present invention is intended to shorten the sensing time required to sense a touch location and a touch force because the process of varying the frequency of an input electric signal is not required.

An inductive touch force sensor according to the present invention is intended to simultaneously recognize both a touch location and a touch force using only an inductive touch sensor without a capacitive sensor, thereby shortening sensing time and also reducing power consumption during sensing.

Meanwhile, in the case where all buttons disposed on an enclosure configured to surround the interior of an electronic device (e.g., a smart device, or a wearable device) are implemented as an inductive touch force sensor, a means for selecting turning on and off power from the outside is required. Since the inductive touch force sensor operates on condition that an AC current is applied to a coil, internal power needs to be turned on before the inductive touch force sensor operates.

Another object of the present invention is to propose an electronic device having a cutout-free enclosure in which a plurality of user buttons is implemented as an inductive touch force sensor and recognizes various user gestures and a stable power-on button configured to operate the inductive touch force sensor is included.

According to an aspect of the present invention, there is provided an inductive force sensor including: a first part configured to be exposed to an external force in a Z-axis direction and to be elastically deformable along the Z-axis direction by the external force in the Z-axis direction; an inductive coil formed on a substrate that is spaced apart from the first part; a first resonance circuit coupled to the inductive coil, and configured to have a first resonant frequency attributable to first inductance due to the inductive coil based on the displacement of the first part relative to the inductive coil; a first oscillator configured to apply a first AC signal to the first resonance circuit; a reference resonance circuit configured to have the same impedance as a predetermined first state of the states that the first resonance circuit can have; a reference oscillator configured to have the same characteristics as the first oscillator and to apply a reference AC signal to the reference resonance circuit; and a determination circuit configured to receive a first electric signal formed in the first resonance circuit, to receive a reference electric signal formed in the reference resonance circuit and to determine the displacement of the first part and the external force in the Z-axis direction based on the first resonant frequency of the first electric signal and the reference resonant frequency of the reference electric signal.

The determination circuit may detect the difference between the reference resonant frequency of the reference electric signal, formed in the reference resonance circuit by the influence of the reference AC signal that is applied to the reference resonance circuit, and the first resonant frequency, and may obtain quantified sensing information about the extent to which the first resonance circuit deviates from the first state based on the difference between the reference resonant frequency and the first resonant frequency, the displacement of the first part relative to the inductive coil, and the external force in the Z-axis direction.

When the difference between the reference resonant frequency and the first resonant frequency is equal to or larger than a first threshold value, the determination circuit may sense that the first resonant frequency has caused a significant change and thus determine that the external force in the Z-axis direction has been input.

The inductive coil may be formed in such a manner that a plurality of elementary coils of windings is arranged in a concentric overlapping structure.

The inductive channel coil may include a set of a plurality of elementary coils, and the plurality of elementary coils may have a structure in which a portion of each of the elementary coils is farther spaced apart from the other portions as it becomes away from a specific location.

The determination circuit may recognize quantified sensing information about the external force in the Z-axis direction in an area facing or covered by the inductive coil and a user gesture intended by the external force in the Z-axis direction based on the change pattern of the difference between the reference resonant frequency and the first resonant frequency in a time domain.

The determination circuit may include: an operator circuit configured to obtain the difference between the first resonant frequency and the reference resonant frequency; a low-pass filter connected to the output terminal of the operator circuit, and configured to remove a high-frequency component; and a time-to-digital converter connected to the output terminal of the low-pass filter, and configured to digitally count the frequency of a differential frequency component signal corresponding to the difference between the first resonant frequency and the reference resonant frequency.

The determination circuit may perform a calibration process based on the difference between the first resonant frequency and the reference resonant frequency in the state forced externally such that the first resonance circuit is in the first state.

According to another aspect of the present invention, there is provided an inductive force sensor including: a second part including a plurality of separated areas configured to be exposed to an external force in a Z-axis direction and to be elastically deformable along the Z-axis direction by the external force in the Z-axis direction; a plurality of inductive coils formed on a substrate that is spaced apart from the second part, and disposed to correspond to the plurality of separated areas and to face the plurality of separated areas; a first channel resonance circuit coupled to a first inductive coil of the plurality of inductive coils, and configured to have a first resonant frequency attributable to first inductance due to the first inductive coil based on the first displacement of a first separated area relative to the first inductive coil; a first oscillator configured to apply a first AC signal to the first channel resonance circuit; a second channel resonance circuit coupled to a second inductive coil of the plurality of inductive coils, and configured to have a second resonant frequency attributable to second inductance due to the second inductive coil based on the second displacement of a second separated area relative to the second inductive coil; a second oscillator configured to apply a second AC signal to the second channel resonance circuit; a reference resonance circuit configured to have the same impedance as a predetermined first state of the states that the first channel resonance circuit can have and a predetermined second state of the states that the second channel resonance circuit can have; a reference oscillator configured to have the same characteristics as the first and second oscillators and to apply a reference AC signal to the reference resonance circuit; and a determination circuit configured to receive a first electric signal formed in the first channel resonance circuit, a second electric signal formed in the second channel resonance circuit, and a reference electric signal formed in the reference resonance circuit and to determine the first displacement, the second displacement, the location at which the external force in the Z-axis direction has been input, and the external force based on the first resonant frequency of the first electric signal, the second resonant frequency of the second electric signal, and the reference resonant frequency of the reference electric signal.

The determination circuit may detect the difference between the reference resonant frequency of the reference electric signal, formed in the reference resonance circuit by the influence of the reference AC signal that is applied to the reference resonance circuit, and the first resonant frequency, may obtain quantified sensing information about the extent to which the first channel resonance circuit deviates from the first state, the first displacement of the first separated area, and the external force in the Z-axis direction appearing in the first separated area corresponding to the first inductive coil based on the difference between the reference resonant frequency and the first resonant frequency, may sense the difference between the reference resonant frequency and the second resonant frequency, and may obtain quantified sensing information about the extent to which the second channel resonance circuit deviates from the second state, the second displacement of the second separated area, and the external force in the Z-axis direction appearing in the second separated area corresponding to the second inductive coil based on the difference between the reference resonant frequency and the second resonant frequency.

When at least one of the difference between the reference resonant frequency and the first resonant frequency and the difference between the reference resonant frequency and the second resonant frequency is equal to or larger than a first threshold value, the determination circuit may sense that at least one of the first resonant frequency and the second resonant frequency has caused a significant change and thus determine that the external forces in the Z-axis direction have been input.

The determination circuit may recognize quantified sensing information about the external force in the Z-axis direction in the first area facing or covered by the first inductive coil, quantified sensing information about the external force in the Z-axis direction in the second area facing or covered by the second inductive coil, and a user gesture intended by the external forces in the Z-axis direction based on a first change pattern of the difference between the reference resonant frequency and the first resonant frequency in the time domain and a second change pattern of the difference between the reference resonant frequency and the second resonant frequency in the time domain.

The determination circuit may extract quantified sensing information about the external force in the Z-axis direction in the first area facing or covered by the first inductive coil and quantified sensing information about the external force in the Z-axis direction in the second area facing or covered by the second inductive coil and determine whether or not the external forces in the Z-axis direction are input intended by a user based on the difference between the reference resonant frequency and the first resonant frequency and the difference between the reference resonant frequency and the second resonant frequency.

The determination circuit may include: an operator circuit configured to multiply the first resonant frequency and the reference resonant frequency and to multiply the second resonant frequency and the reference resonant frequency; a low-pass filter connected to the output terminal of the operator circuit, and configured to remove a high-frequency component; and a time-to-digital converter connected to the output terminal of the low-pass filter, and configured to digitally count the frequency of a first differential frequency component signal corresponding to the difference between the first resonant frequency and the reference resonant frequency and to digitally count the frequency of a second differential frequency component signal corresponding to the difference between the second resonant frequency and the reference resonant frequency.

According to still another aspect of the present invention, there is provided a method of operating an inductive force sensor, the inductive force sensor including a first part configured to be exposed to an external force in a Z-axis direction and to be elastically deformable along the Z-axis direction by the external force in the Z-axis direction and an inductive coil formed on a substrate that is spaced apart from the first part; the method including: applying, by a first oscillator, a first AC signal to a first resonance circuit that is coupled to the inductive coil and has a first resonant frequency attributable to first inductance due to the inductive coil based on the displacement of the first part relative to the inductive coil; applying, by a reference oscillator having the same characteristics as the first oscillator, a reference AC signal to a reference resonance circuit that has the same impedance as a predetermined first state of the states that the first resonance circuit can have; receiving, by a determination circuit, a first electric signal that is formed in the first resonance circuit by the influence of the first AC signal; receiving, by the determination circuit, a reference electric signal that is formed in the reference resonance circuit; and determining, by the determination circuit, the displacement of the first part and the external force in the Z-axis direction based on the first resonant frequency of the first electric signal and the reference resonant frequency of the reference electric signal.

The determining the external force in the Z-axis direction may include detecting the difference between the reference resonant frequency and the first resonant frequency, and obtaining quantified sensing information about the extent to which the first resonance circuit deviates from the first state, the displacement of the first part relative to the inductive coil, and the external force in the Z-axis direction based on the difference between the reference resonant frequency and the first resonant frequency.

The method may further include recognizing, by the determination circuit, quantified sensing information about the external force in the Z-axis direction in the channel area facing or covered by the inductive coil and a user gesture intended by the external force in the Z-axis direction based on the change pattern of the difference between the reference resonant frequency and the first resonant frequency in the time domain.

According to still another aspect of the present invention, there is provided a method of operating an inductive force sensor, the inductive force sensor including a second part including a plurality of separated areas configured to be exposed to an external force in a Z-axis direction and to be elastically deformable along the Z-axis direction by the external force in the Z-axis direction, and a plurality of inductive coils formed on a substrate that is spaced apart from the second part and disposed to correspond to the plurality of separated areas and to face the plurality of separated areas respectively, the method including: applying, by a first oscillator, a first AC signal to a first channel resonance circuit coupled to a first inductive coil of the plurality of inductive coils and configured to have a first resonant frequency attributable to first inductance formed in the first inductive coil based on the first displacement of a first separated area relative to the first inductive coil; applying, by a second oscillator, a second AC signal to a second channel resonance circuit coupled to a second inductive coil of the plurality of inductive coils and configured to have a second resonant frequency attributable to second inductance formed in the second inductive coil based on the second displacement of a second separated area relative to the second inductive coil; applying, by a reference oscillator configured to have the same characteristics as the first and second oscillators, a reference AC signal to a reference resonance circuit configured to have the same impedance as a predetermined first state of the states that the first channel resonance circuit can have and a predetermined second state of the states that the second channel resonance circuit can have; receiving, by a determination circuit, a first electric signal formed in the first channel resonance circuit; receiving, by the determination circuit, a second electric signal formed in the second channel resonance circuit; receiving, by the determination circuit, a reference electric signal formed in the reference resonance circuit; and determining, by the determination circuit, the first displacement, the second displacement, a location at which the external force in the Z-axis direction has been input, and the external force based on the first resonant frequency of the first electric signal, the second resonant frequency of the second electric signal, and a reference resonant frequency of the reference electric signal.

The determining, by the determination circuit, the location at which the external force in the Z-axis direction has been input and the external force may include: detecting the difference between the reference resonant frequency and the first resonant frequency; detecting the difference between the reference resonant frequency and the second resonant frequency; obtaining quantified sensing information about the extent to which the first resonance circuit deviates from the first state, the first displacement of the first separated area within the second part, and the external force in the Z-axis direction appearing in the first separated area corresponding to the first inductive coil based on the difference between the reference resonant frequency and the first resonant frequency; and obtaining quantified sensing information about the extent to which the second resonance circuit deviates from the second state, the second displacement of the second separated area within the second part, and the external force in the Z-axis direction appearing in the second separated area corresponding to the second inductive coil based on the difference between the reference resonant frequency and the second resonant frequency.

According to still another aspect of the present invention, there is provided an electronic device including: an enclosure configured to surround the interior of the electronic device; a first area disposed on the enclosure, and configured to operate as a power-on button; and a plurality of second areas arranged to be elastically deformable in a Z-axis direction by an external force applied in the Z-axis direction in the remaining areas of the enclosure excluding the first area. A pressure-sensing variable resistor configured to respond to pressure from the outside is disposed in the first area, and the pressure-sensing variable resistor and the internal power of the electronic device are connected to a power-on button on/off sensing circuit. A plurality of inductive coils disposed to be spaced apart from the second areas and to be opposite to the respective second areas inside the electronic device may form individual channel resonant frequencies deviating from the reference resonant frequency based on individual channel displacements by which the second areas are elastically deformed in the Z-axis direction by an external force applied in the Z-axis direction, and the determination circuit may determine the individual channel displacements and external forces applied in the Z-axis direction to the second areas based on the individual channel resonant frequencies.

The plurality of individual channel resonance circuits is coupled to the plurality of inductive coils, respectively, and has individual channel resonant frequencies attributable to individual channel inductances formed in the plurality of inductive coils based on the individual channel displacements of the plurality of second areas in the Z-axis direction relative to the plurality of inductive coils. The reference resonant circuit is set to have the same impedance as a predetermined first state of the states that the plurality of individual channel resonant circuits can have. In this case, on the assumption that the first state corresponds to a case where external forces applied to the plurality of second areas in the Z-axis direction are 0, the reference resonance circuit and the plurality of individual channel resonance circuits may be designed.

The determination circuit may receive a reference electric signal formed in the reference resonance circuit by the influence of a reference AC signal applied to the reference resonance circuit and a plurality of individual channel electric signals formed in the plurality of individual channel resonance circuits by the influence of individual channel AC signals applied to the plurality of individual channel resonance circuits, and may determine the individual channel displacements, the locations at which external forces applied in the Z-axis direction have been input in the plurality of second areas and the external forces applied in the Z-axis direction based on the reference resonant frequency of the reference electric signal and the individual channel resonant frequencies of the plurality of individual channel electric signals.

When a change in the resistance value of the pressure-sensing variable resistor attributable to pressure on the first area from the outside is equal to or larger than a first threshold value, the power-on button on/off sensing circuit may perform control so that the internal power is applied to the plurality of inductive coils, the plurality of individual channel resonance circuits, the reference resonance circuit, and the determination circuit.

The determination circuit may obtain quantified sensing information about the extents to which the plurality of individual channel resonance circuits deviates from the first state, the individual channel displacements of the plurality of second areas in the Z-axis direction, and the external forces applied to the plurality of second areas in the Z-axis direction based on the extents to which the individual channel resonant frequencies of the plurality of the individual channel resonance circuits deviate from the reference resonant frequency.

When the extent to which a first individual channel resonant frequency of the individual channel resonant frequencies of the plurality of individual channel resonance circuits deviates from the reference resonant frequency is equal to or larger than a second threshold value, the determination circuit may sense that the first individual channel resonant frequency has caused a significant change and thus determine that the external force applied in the Z-axis direction has been input to a first separated area corresponding a first individual channel resonance circuit in which the first individual channel resonant frequency is formed.

The determination circuit may recognize quantified sensing information about an external force applied in the Z-axis direction to the first separated area covered by a first inductive coil to which the first individual channel resonance circuit is coupled and a user gesture intended by the external force applied in the Z-axis direction based on the change pattern of the difference between the reference resonant frequency and the first individual channel resonant frequency appearing in the time domain.

The determination circuit may recognize quantified first sensing information about an external force applied in the Z-axis direction to the first separated area covered by the first inductive coil to which the first individual channel resonance circuit is coupled, quantified second sensing information about an external force applied in the Z-axis direction to the second separated area covered by the second inductive coil to which the second individual channel resonance circuit is coupled, and a user gesture intended by the external forces applied in the Z-axis direction based on a first change pattern appearing in the time domain for the difference between the first individual channel resonant frequency of a first individual channel resonance circuit of the plurality of individual channel resonance circuits and the reference resonant frequency and a second change pattern appearing in the time domain for the difference between the second individual channel resonant frequency of a second individual channel resonance circuit of the plurality of individual channel resonance circuits and the reference resonant frequency.

The determination circuit may extract quantified first sensing information about an external force applied in the Z-axis direction to the first separated area covered by a first inductive coil to which the first individual channel resonance circuit is coupled and quantified second sensing information about an external force applied in the Z-axis direction to the second separated area covered by a second inductive coil to which the second individual channel resonance circuit is coupled based on a first change pattern appearing in the time domain for the difference between the first individual channel resonant frequency of a first individual channel resonance circuit of the plurality of individual channel resonance circuits and the reference resonant frequency and a second change pattern appearing in the time domain for the difference between the second individual channel resonant frequency of a second individual channel resonance circuit of the plurality of individual channel resonance circuits and the reference resonant frequency, and may determine whether or not the external forces applied in the Z-axis direction are input intended by a user based on the first sensing information and the second sensing information.

The determination circuit may include: an operator configured to obtain quantified information about the extents to which the individual channel resonant frequencies of the plurality of individual channel resonance circuits deviate from the reference resonant frequency; a low-pass filter connected to the output terminal of the operator, and configured to remove a high-frequency component; and a time-to-digital converter connected to the output terminal of the low-pass filter, and configured to digitally count the frequency of a differential frequency component signal corresponding to the extents to which the individual channel resonant frequencies of the plurality of individual channel resonance circuits deviate from the reference resonant frequency.

The determination circuit may perform a calibration process on the plurality of individual channel resonance circuits based on quantified information about the extents to which the individual channel resonant frequencies of the plurality of individual channel resonance circuits deviate from the reference resonant frequency in the state in which forcible adjustment has been performed from the outside such that the plurality of individual channel resonance circuits is in the first state.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

The objects of the present invention other than the above-described objects and the features of the present invention will become apparent from the following description of embodiments taken in conjunction with the accompanying drawings. The embodiments of the present invention will be described in detail below with reference to the accompanying drawings. In the following description, when it is determined that a detailed description of a known component or function may unnecessarily make the gist of the present invention obscure, it will be omitted. An inductive touch force sensor and a method of operating the same according to embodiments of the present invention will be described in detail below with reference to FIGS. 1 to 13.

Figure 1:
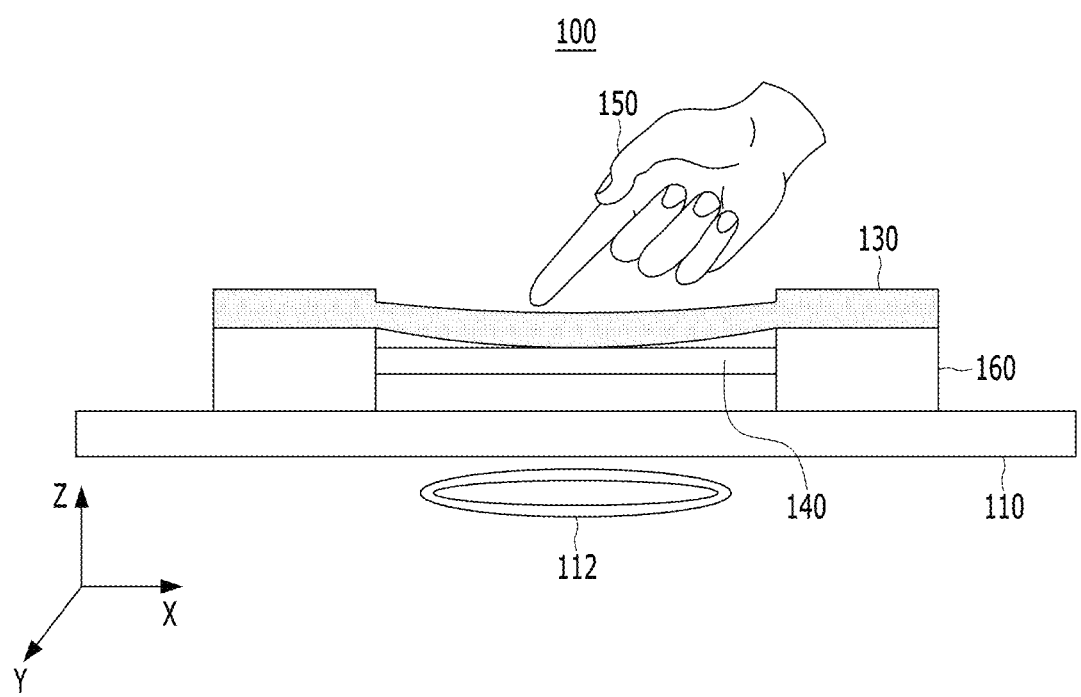
FIG. 1 is a view showing an inductive touch force sensor according to an embodiment of the present invention.

FIG. 1 is a view showing an inductive touch force sensor 100 according to an embodiment of the present invention. In FIG. 1, there is shown the inductive touch force sensor 100 in which a single button, channel, and coil are assumed.

Referring to FIG. 1, the inductive touch force sensor 100 according to the present embodiment includes: a first part 130 configured to be exposed to an external force 150 in a Z-axis direction and to be elastically deformable along the Z-axis direction by the external force 150 in the Z-axis direction; a target layer 140 disposed to be movable in the Z-axis direction based on the deformation of the first part 130; an inductive coil 112 formed on a substrate 110 that is spaced apart from the target layer 140; and a spacer layer 160 configured to support the first part 130 and to separate the inductive touch force sensor 100 from another sensor or a sensing channel. The substrate 110 may be a PCB or FPCB.

The inductive touch force sensor 100 shown in FIG. 1 forms a single channel. In an embodiment, a plurality of inductive touch force sensors, each of which is the same as the inductive touch force sensor 100 shown in FIG. 1, may be arranged in parallel and thus implement an array or matrix.

When the first part 130 is elastically deformed by the external force 150 applied in the Z-axis direction, the target layer 140 is movable in the Z-axis direction according to the degree of the deformation of the first part 130. In this case, the inductive coil 112 and target layer 140 formed on the substrate 110 are inductively coupled to each other.

In this case, a material having elastic restoring force, e.g., foam, may be disposed between the target layer 140 and the inductive coil 112. When the external force 150 is applied, the target layer 140 approaches the inductive coil 112, and thus the inductance due to the inductive coil 112 inductively coupled to the target layer 140 changes.

When the external force 150 is removed, the target layer 140 returns to its original location before the deformation due to the elastic restoring force of the foam. In other words, a change in inductance appears only while the external force 150 is being applied. The external force 150 in the Z-axis direction may be sensed by sensing the change.

When the distance by which the target layer 140 is spaced apart from the inductive coil 112 in a first state in which the external force 150 is not applied is d0 and the distance by which the target layer 140 is spaced apart from the inductive coil 112 in the state in which the external force 150 is applied is d, the displacement $\Delta d = |d - d0|$ is the cause of a change in inductance formed by the inductive coil 112 inductively coupled to the target layer 140. Therefore, when a change in inductance is sensed, the displacement $\Delta d$ may be sensed, and the size of the external force 150 may be qualified.

Figure 2:
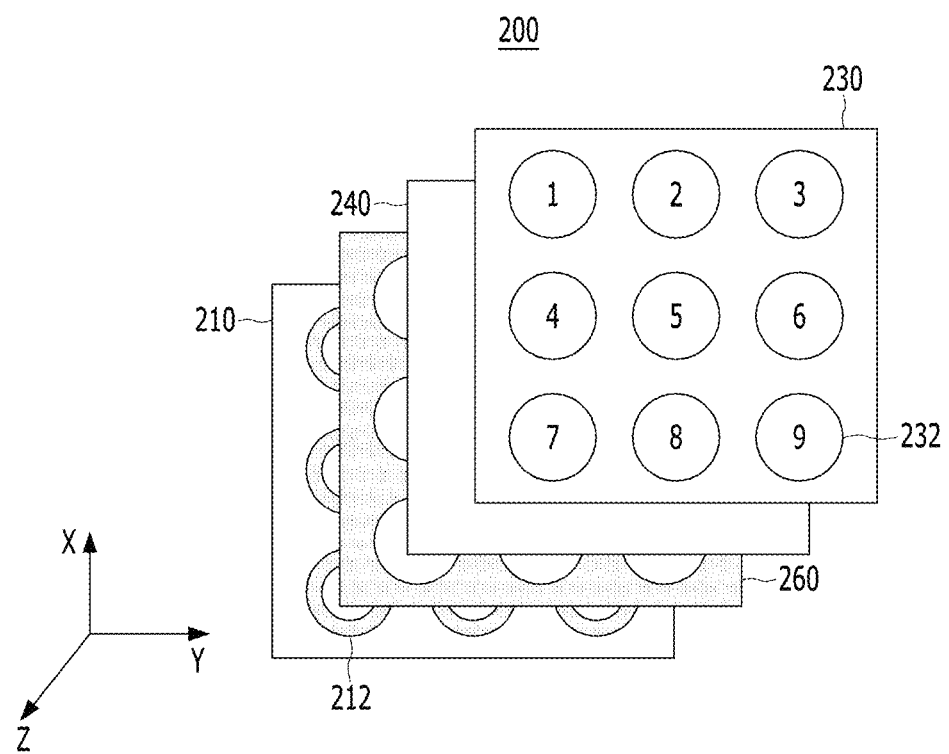
FIG. 2 is a view showing an inductive touch force sensor according to an embodiment of the present invention.

In the present specification, for ease of description, a unit for sensing an external force 150 in an area corresponding to (facing or covered by) each inductive coil 112 is referred to as a "channel." The target layer 140 may be separated from other channels and disposed for each channel, as shown in FIG. 1, or may be shared within a group including a plurality of channels, as shown in FIG. 2 to be described later. In FIG. 1, there is shown an embodiment in which the target layer 140 is disposed for each channel and each channel is physically separated from other channels by the spacer layer 160.

The target layer 140 may be made of non-magnetic metal or magnetic metal. The target layer 140 is preferably made of a conductor having conductivity so that an eddy current is generated. Depending on whether or not the target layer 140 has magnetism, it may be determined whether the inductance increases or decreases when the external force 150 is applied. Based on whether the target layer 140 is magnetic or non-magnetic and the hardware design of the channel, a material having an optimized variable, such as optimized inductance sensing sensitivity to displacement, may be selected for the target layer 140.

In an embodiment, the inductive coil 112 of the inductive touch force sensor 100 may be formed in such a manner that a plurality of elementary coils of windings is arranged in a concentric overlapping structure.

Although the target layer 140 may be moved in the Z-axis direction by the external force 150 and the target layer 140 may be kept parallel with the inductive coil 112 in an implementation, the target layer 140 may be moved while being slightly inclined with respect to the inductive coil 112 depending on a location on an X-Y plane on which the external force 150 is concentrated in the state of being not parallel with the inductive coil 112 according to an embodiment of the present invention. This becomes a measurement error factor that makes it difficult to perform accurate touch force sensing in the related arts. In contrast, in the present invention, a change in inductance may be precisely quantified based on the differential sensing of inductance. Accordingly, a touch force may be accurately sensed. In an embodiment, a location on an X-Y plane at which the external force 150 is concentrated may be sensed. This embodiment will be described in conjunction with FIGS. 5 and 6.

Most wearable devices use mechanical buttons requiring cutouts in enclosures that form boundaries with the outside, thereby making it difficult to seal the devices and also lowering an IP rating, which implies dustproofing and waterproofing functions. Furthermore, the mechanical buttons use moving parts, metallic contacts, and gaskets. They have a problem with long-term reliability, suffer from an increase in cost, and have a problem in which resistance to an environmental factor is low.

If a cutout-free enclosure is implemented, a high IP rating may be implemented, and also a wearable device having a high IP rating may be utilized for various purposes for which a previous wearing device is not utilized. When a wearable device uses neither a gasket nor moving parts, the wearable device may be physically more robust. For example, such an electronic device may be embedded in wearable items such as gloves, and may also be utilized underwater.

In order to achieve such a high IP rating, attempts have been made to utilize an electromagnetic device configured to sense touch pressure instead of a mechanical button. As one of these attempts, there is an approach that attempts to use a capacitive proximity sensor. However, the capacitive proximity sensor is influenced by both an electric field and surrounding conductivity, and thus it is difficult to use the above approach underwater and the range of use of the approach is limited.

Instead of the capacitive proximity sensor, there has been proposed an inductive touch sensor that measures inductance by generating a change in the magnetic field in a manner to recognize touch pressure by measuring a change in impedance. The fact that the inductive sensor is less sensitive to an external disturbance than the capacitive sensor causes the use of the inductive sensor to spread.

A method of implementing an inductive touch force sensor using an inductive touch sensor is disclosed in the above-described related art documents, for example, U.S. Patent Application Publication No. US 2018/0180450 entitled "Inductive Touch Input," U.S. Patent Application Publication No. US 2017/0016255 entitled "Device for Detecting a User's Intention to Lock or Unlock a Motor Vehicle Door, and Korean Patent No. 10-1920440 entitled "Self-Inductive Touch Force Sensor Module for 3D Touch Implementation."

Meanwhile, the inductive sensor that needs to use a change in the magnetic field is not easy to increase sensing accuracy compared to the capacitive sensor capable of precise sensing using an electrical signal. The inductive sensing technologies of the related art documents do not perform precise sensing, but sense merely whether a value in question is equal to or higher than a threshold value. Those inductive sensing technologies are chiefly used to sense a specific event.

The configuration of FIG. 1 and the related art documents may be included as part of the configuration of the present invention, and may be combined with the new configurations of the present invention to achieve the unique effects of the present invention. In particular, recently, in combination with a mobile device, a smart device, virtual reality, augmented reality, and/or the like, a user interface aims to precisely recognize touch forces, to accurately recognize a user's gestures, and to determine the user's intentions. The present invention proposes technology for determining a user's intention and accurately identifying the user's gesture by precisely measuring and quantifying a touch force and the displacement of a target and change in inductance attributable to the touch force through the improvement of the inductive sensing of the related art.

According to an embodiment of the present invention, when a separate coil is not disposed in the target layer 140, the displacement of the target layer 140 may be measured by self-induction through the interaction between the inductive coil 112 and the eddy current of the target layer 140.

According to another embodiment of the present invention, a mutual inductive coil (not shown) is disposed in the target layer 140, and the displacement of the target layer 140 may be measured by mutual induction through the interaction between the mutual inductive coil of the target layer 140 and the inductive coil 112 on the substrate 110.

FIG. 2 is a view showing an inductive touch force sensor 200 according to an embodiment of the present invention.

Referring to FIG. 2, the inductive touch force sensor 200 according to the present embodiment includes: a second part 230 including a plurality of separated areas 232 configured to be exposed to an external force in a Z-axis direction and to be elastically deformable along the Z-axis direction by the external force in the Z-axis direction; a target layer 240 disposed to be movable in the Z-axis direction when at least one of the plurality of separated areas 232 of the second part 230 is deformed; and a plurality of inductive coils 212 formed on a substrate 210 that is spaced apart from the target layer 240, and disposed to correspond to the plurality of separated areas 232 and to face the plurality of separated areas 232.

The second part 230 may be made of an elastically deformable material, and the separated areas 232 may be made of the same material as the area of the second part 230 excluding the separated areas 232. In other words, the second part 230 may cover the overall area of the inductive touch force sensor 200, shown in FIG. 2, with a single covering, and thus the IP rating of the inductive touch force sensor 200 may be increased. For example, assuming that the separated areas 232 have independent numbers in a smartwatch, as shown in FIG. 2, the separated areas 232 exposed from the smartwatch are covered with the single covering, and thus excellent dustproof and waterproof performance is expected. The separated areas 232 are disposed corresponding to the holes of the spacer layer 260. Accordingly, when an external force is applied to any one of the separated areas 232, the corresponding area is elastically deformable based on the elasticity of the second part 230.

In an embodiment, the inductive touch force sensor 200 of FIG. 2 may be located on the bezel, side or back surface of a mobile device, and the separated areas 232 may be small in size and densely disposed in order not to be identified by a user. In this case, the inductive touch force sensor 200 may be utilized as a means for determining whether a user holds the corresponding device or has input a predetermined user gesture to the area of the inductive touch force sensor 200 of the corresponding device.

Unlike in FIG. 1, in FIG. 2, the target layer 240 is shared in a module including the plurality of separated areas 232 and the inductive coils 212. Assuming that the spacer layer 260 has a weak elastic restoring force, the target layer 240 is twisted in an XYZ space and also provides an asymmetric displacement to the inductive coils 212 depending on which of the separated areas 232 a touch force is applied to. For example, the inductance distribution formed on the inductive coils 212 when button No. 1 is pressed and the inductance distribution formed on the inductive coils 212 when button No. 6 is pressed will be different from each other. A controller for the inductive touch force sensor 200 may previously store these patterns through a test process. The inductive touch force sensor 200 may extract the input intended by a user by comparing an inductance distribution pattern formed on the plurality of inductive coils 212 when an external force is actually applied with the previously stored inductance distribution patterns.

In the related arts, it is not easy to simultaneously sense inductances over a plurality of channels. In the present invention, inductances in a plurality of channels may be simultaneously sensed without a substantial time difference and quantified data may be obtained, and thus the spatial distribution of a touch force within an area corresponding to (facing or covered by) the inductance force sensor 200 may be obtained and the accurate intention of a user may be determined.

According to one of the embodiments of the present invention, when a separate coil is not disposed in the target layer 240, the displacement of the target layer 240 may be measured by self-induction through the interaction between the inductive coil 212 and the eddy current of the target layer 240.

According to another embodiment of the present invention, a mutual inductive coil (not shown) may be disposed in the target layer 240, and the displacement of the target layer 240 may be measured by mutual induction through the interaction between the mutual inductive coil of the target layer 240 and the inductive coil 212 on the substrate 210.

Figure 3:
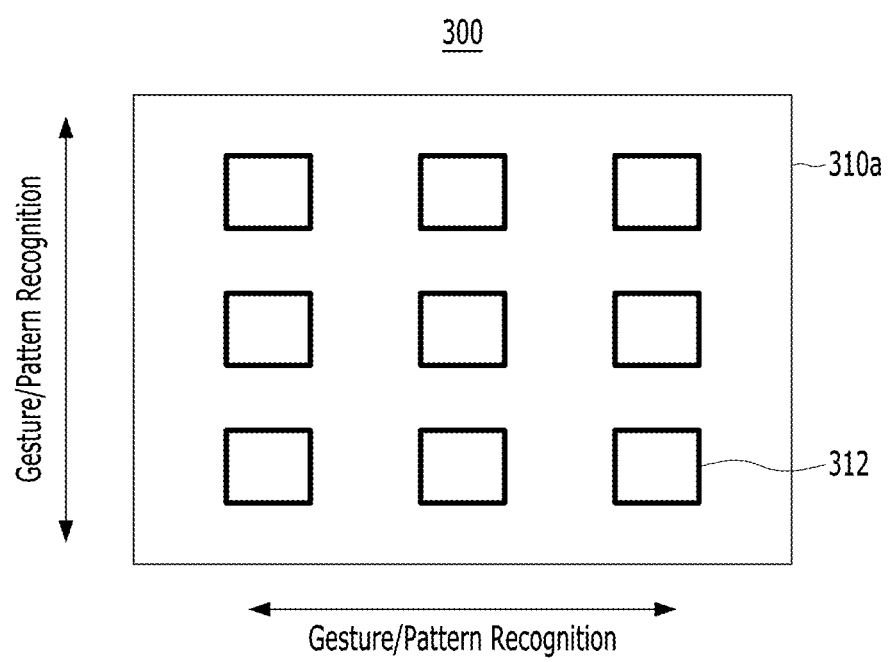
FIG. 3 is a view showing an inductive touch force sensor according to an embodiment of the present invention and a method of operating the same.

FIG. 3 is a view showing an inductive touch force sensor 300 according to an embodiment of the present invention and a method of operating the same.

Referring to FIG. 3, a single module 310a is shown as a set of coils including a plurality of coils 312 in an inductive touch force sensor 300.

The pattern in which a touch force of a user changes temporarily and spatially within an area facing or covered by the module 310a may be tracked by tracking the spatial distribution of the inductance formed in the plurality of coils 312 within the module 310a on an X-Y plane in a time domain.

The inductive touch force sensor 300 may analyze the direction and speed in and at which the center of an external force moves on the X-Y plane in the time domain by tracking the spatial distribution of the external force in the Z-axis direction, recognized in the separated areas facing or covered by the plurality of coils 312, on the X-Y plane in the time domain. According to this, the inductive touch force sensor 300 may recognize the pattern of a touch force applied in the area facing or covered by the inductive touch force sensor 300 by a user, i.e., a user gesture such as tapping, sliding/scrolling/swiping, or zooming in/zooming out, by using an inductive sensing technique.

The inductive touch force sensor 300 may derive movement information on the X-Y plane in which the central location of a touch force moves on the X-Y plane by combining X-axis movement information in which the central location of the touch force moves in an X-axis direction and Y-axis movement information in which the central location of the touch force moves in a Y-axis direction. In still another embodiment, the inductive touch force sensor 300 may obtain gesture information in which the central location of a touch force moves on the X-Y plane directly from a pattern, in which a touch force changes, obtained from the separated areas facing or covered by the plurality of coils 312, respectively. Furthermore, each piece of channel information is independently obtained. Accordingly, the inductive touch force sensor 300 may recognize a user gesture without confusion even when a user gesture based on multi-touch is input within the sensing area covered by the plurality of coils 312.

Figure 4:
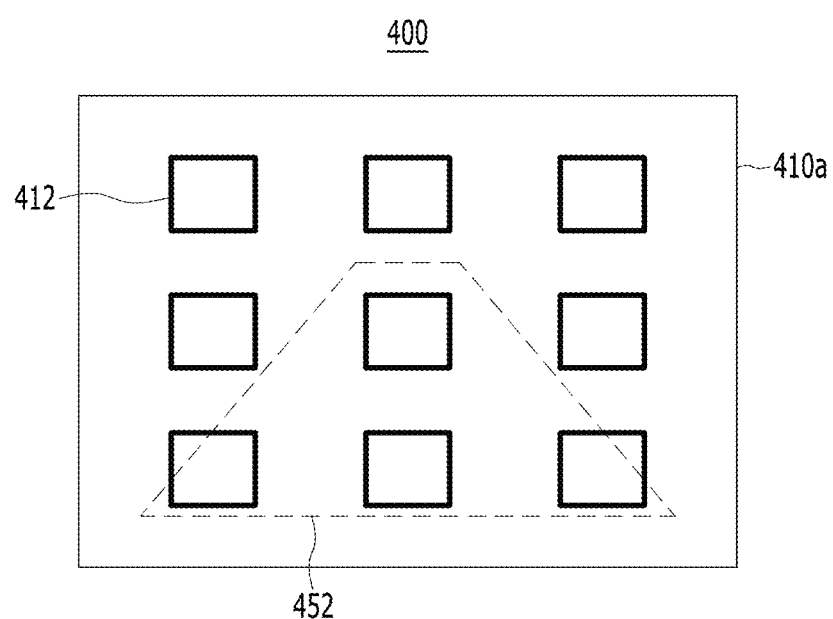
FIG. 4 is a view showing an inductive touch force sensor according to an embodiment of the present invention and a method of operating the same.

FIG. 4 is a view showing an inductive touch force sensor 400 according to an embodiment of the present invention and a method of operating the same.

Referring to FIG. 4, a single module 410a is shown as a set of coils including a plurality of coils 412 within an inductive touch force sensor 400.

For example, in the case where the module 410a is an interface in which numbers are assigned to respective separated areas and are displayed to the outside, when an external force is uniformly measured within a range 452 within which an external force is input to such an extent that it is difficult to specify an separated area, as shown in FIG. 4, it may be determined that a user does not intend to touch a specific number area, but a device is held in hand or pressure is applied from the outside for another reason, thereby preventing the erroneous operation of the device.

For this purpose, it is necessary to substantially simultaneously sense an inductance distribution pattern for separated areas and a plurality of coils 412 included in the module 410a. In the present invention, this is achieved by sensing changes in inductance and a touch force in separated areas associated with respective coils 412 based on a differential resonance signal with a reference inductance. Details related to this will be described later in the description of FIGS. 7 and 8.

Figure 5:
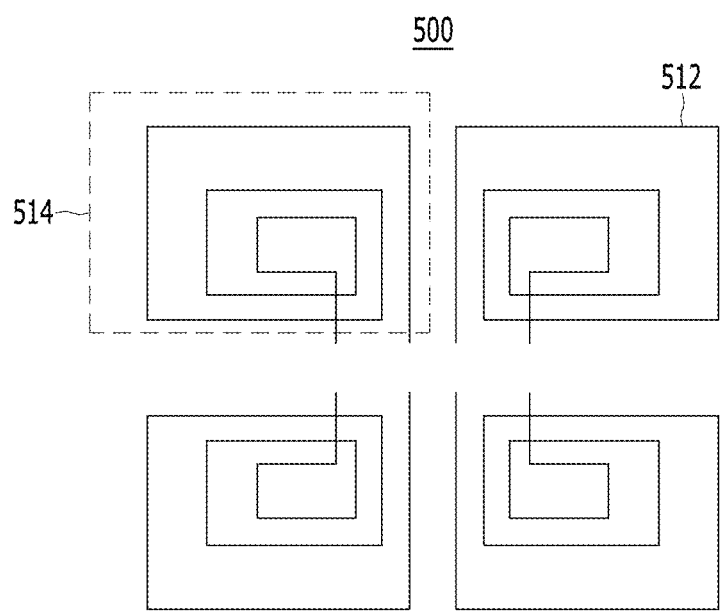
FIG. 5 is a view showing the coil structure of an inductive touch force sensor according to an embodiment of the present invention.

FIG. 5 is a view showing the coil structure of an inductive touch force sensor 500 according to an embodiment of the present invention.

Referring to FIG. 5, the inductive channel coil 512 of the inductive touch force sensor 500 according to the present embodiment includes a set of a plurality of elementary coils, and the plurality of elementary coils may have a structure in which a reference portion of each of the elementary coils is farther spaced apart from the other portions as it becomes away from a specific location.

The target layer 140 shown in FIG. 1 causes displacement in a Z-axis direction when an external force in the Z-axis direction is applied. In this case, the target layer 140 may not necessarily be kept parallel to the inductive coil 512. Accordingly, the target layer 140 may cause displacement in the Z-axis direction in the state of being twisted in an XYZ space. In this case, the displacement of the target layer 140 may vary depending on a location on an X-Y plane on which an external force is concentrated within the channel area 514 facing or covered by the single inductive channel coil 512. In this case, when the coil structure of the inductive coil 512 has a structure in which the interval between the elementary coils of the inductive coil 512 increases or decreases as a reference location becomes away from the center of the inductive touch force sensor 500, as shown in FIG. 5, a change in inductance sensed by the inductive coil 512 may vary depending on the location on the X-Y plane on which an external force is concentrated within the channel area 514. Accordingly, the location on the X-Y plane on which an external force is concentrated within the channel area 514 may be identified by comparing previously tested and stored quantified inductance patterns with an actually measured quantified inductance pattern.

In this case, a user gesture, such as tapping, or sliding/scrolling/swiping, may be recognized even in a single-channel inductive touch force sensor by identifying and tracking the location on the X-Y plane on which an external force is concentrated within the channel area 514 in a time domain.

Although the structure of each of the inductive coils 512 is asymmetric in FIG. 5, the inductive touch force sensor 500 may be implemented such that a single module has symmetry when a set of inductive coils 512 constitute the single module.

Figure 6:
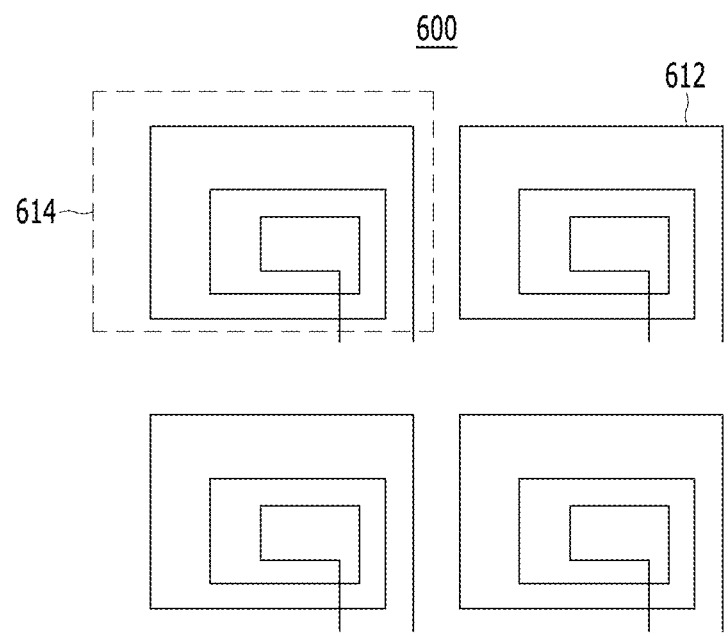
FIG. 6 is a view showing the coil structure of an inductive touch force sensor according to an embodiment of the present invention.

FIG. 6 is a view showing the coil structure of an inductive touch force sensor 600 according to an embodiment of the present invention.

Referring to FIG. 6, the inductive channel coil 612 of the inductive touch force sensor 600 according to the present embodiment includes a set of a plurality of elementary coils, and the plurality of elementary coils may have a structure in which a reference portion of each of the elementary coils is farther spaced apart from the other portions as it becomes away from a specific location.

In this case, in the same manner as described in conjunction with FIG. 5 above, a location on an X-Y plane on which an external force is concentrated within a channel area 614 facing or covered by a single inductive channel coil 612 may be identified, and a user gesture may be recognized even within the single channel area 614 by tracking the location on which an external force is concentrated on the X-Y plane in a time domain.

In FIG. 6, the structure of each inductive coil 612 is asymmetric. When a set of inductive coils 612 constitutes a single module, the module still has asymmetry, but the inductive touch force sensor 600 may implement regularity.

Figure 7:
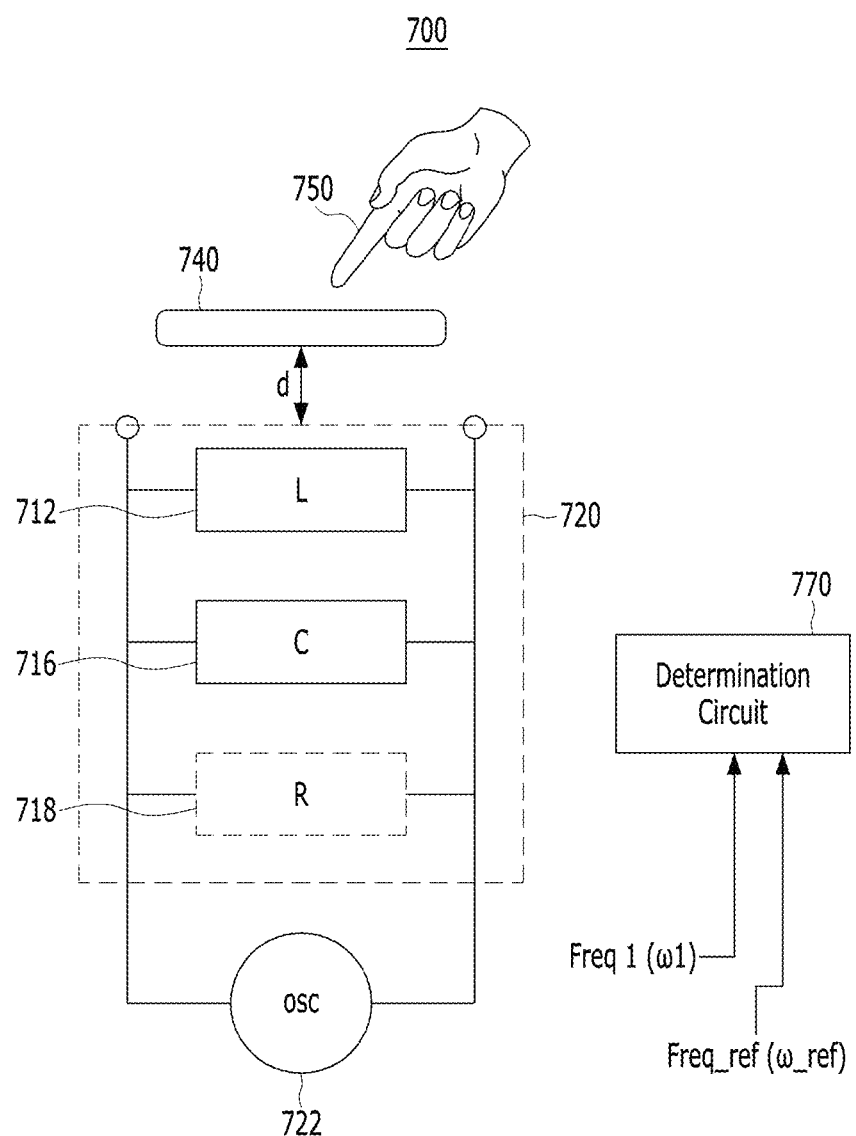
FIG. 7 is a view showing the circuit of an inductive touch force sensor and a method of operating the same according to an embodiment of the present invention.

FIG. 7 is a view showing the circuit of an inductive touch force sensor 700 and a method of operating the same according to an embodiment of the present invention.

Referring to the inductive touch force sensor 100 of FIG. 1 and the circuit of FIG. 7 together, the inductive touch force sensor 100 or 700 includes a first resonance circuit 720 that is coupled to an inductive coil 112 or 712 and has a first resonant frequency $\omega 1$ attributable to a first inductance due to the inductive coil 112 or 712 based on the displacement of a target layer 140 or 740 relative to the inductive coil 112 or 712.

In this case, the inductive touch force sensor 100 or 700 according to the present embodiment includes: a first oscillator 722 configured to apply a first AC signal to the first resonance circuit 720; a reference resonance circuit (not shown in FIG. 7) configured to have the same impedance as a predetermined first state (a state in which an external force 150 or 750 is not applied is preferred) of the states that the first resonance circuit 720 can have; a reference oscillator (not shown in FIG. 7) configured to have the same characteristics as the first oscillator 722 and to apply a reference AC signal to the reference resonance circuit; and a determination circuit 770 configured to receive a first electric signal formed in the first resonance circuit 720, to receive a reference electric signal formed in the reference resonance circuit, and to determine the displacement $\Delta d = |d - d0|$ of the target layer 140 or 740 and the external force 150 or 750 in a Z-axis direction based on the first resonant frequency $\omega 1$ of the first electric signal and the reference resonant frequency $\omega\_ref$ of the reference electric signal.

The determination circuit 770 of the inductive touch force sensor 100 or 700 according to the embodiment of the present invention may sense the difference between the reference resonant frequency $\omega\_ref$ of the reference electric signal, formed in the reference resonance circuit by the influence of the reference AC signal that is applied to the reference resonance circuit, and the first resonant frequency $\omega 1$, and may obtain quantified sensing information about the extent to which the first resonance circuit deviates from the first state based on the difference between the reference resonant frequency $\omega\_ref$ and the first resonant frequency $\omega 1$, the displacement $\Delta d = |d - d0|$ by which the target layer 140 or 740 has moved relative to the inductive coil 112 or 712, and the external force 150 or 750 in the Z-axis direction.

The first resonance circuit 720 shown in FIG. 7 is an equivalent circuit, and does not necessarily include a lumped RLC element. For example, a capacitor C 716 and a resistor R 718 may be independent elements, and may be representative of parasitic components. Furthermore, even when the first resonance circuit 720 is implemented using independent elements, the arrangement of the elements does not necessarily conform to that of FIG. 7, but it is sufficient if the implemented first resonance circuit 720 is equivalent to the first resonance circuit 720 of FIG. 7.

When the difference between the reference resonant frequency $\omega\_ref$ and the first resonant frequency $\omega 1$ is equal to or larger than a first threshold value, the determination circuit 770 of the inductive touch force sensor 100 or 700 according to the embodiment of the present invention may sense/consider that the first resonant frequency $\omega 1$ has caused a significant change and thus determine that the external force 150 in the Z-axis direction has been input. In other words, when a change in first resonant frequency $\omega 1$ is sensed due to noise, unintentional movement, unintentional contact, or unintentional vibration but the change is smaller than the first threshold value, it may be considered that the first resonant frequency $\omega 1$ has not caused a significant change.

The determination circuit 770 of the inductive touch force sensor 100 or 700 according to the embodiment of the present invention may perform a calibration process based on the difference between the first resonant frequency $\omega 1$ and the reference resonant frequency $\omega\_ref$ in the state in which forcible adjustment has been performed from the outside such that the first resonance circuit 720 is in the first state (a state in which the external pressure 150 or 750 is not applied is preferred).

The determination circuit 770 may perform a calibration process. The determination circuit 770 may perform the calibration process in the state in which the external force 150 or 750 is not applied. In this case, the first resonance circuit 720 or the reference resonance circuit may be adjusted such that the difference between the first resonant frequency $\omega 1$ and the reference resonant frequency $\omega\_ref$ becomes zero through the calibration process. Furthermore, the difference between the first resonant frequency $\omega 1$ and the reference resonant frequency $\omega\_ref$ sensed through the calibration process in the first state in which the external force 150 or 750 is not applied may be stored in separate memory or storage, and may be processed as offset information in an inductive force sensing process in the future. After the calibration, the difference between the first resonant frequency $\omega 1$ and the reference resonant frequency $\omega\_ref$ may be adjusted using a means, such as the adjustment of the value of a variable resistor R' that may be added to the first resonance circuit 720 or the like.

In general, the inductive sensing technology known so far is designed to measure a change in impedance after sequentially inputting a plurality of frequency signals through a variable frequency scan. This method requires a precondition in which the sizes of signals are accurately measured and compared. Meanwhile, it is considerably difficult to accurately sense the sizes of signals despite noise in a general inductive sensor.

The present invention sets a change in resonant frequency as a main sensing target instead of setting the amplitudes of signals as a main sensing target, and may sufficiently achieve a desired purpose only by using a means for applying AC signals having the same frequency without adopting a method such as a variable frequency scan. Using this method, the present invention may rapidly sense and quantify a change in inductance at a corresponding point in time. A real-time change in the first resonant frequency $\omega 1$ may be sensed regardless of the amplitudes of resonance signals by the method of FIG. 8 to be described later. Furthermore, the first resonant frequency $\omega 1$ is not sensed by an indirect method, but the value of the frequency is directly sensed. Accordingly, advantages arise in that it is easy to achieve digitalization using the value of the frequency and a change in inductance and a change in touch force may be accurately sensed using the digitized value. Furthermore, a process, such as a variable frequency scan, is not required, and thus a sensing process is fast and power consumption is low. An inductive sensing process for a single coil and channel is rapidly performed and a sensing result is obtained as a digitized value, and thus a change in inductance and a change in touch force may be sensed substantially simultaneously even when a plurality of channels is implemented. When each channel and coil corresponds to a location on the X-Y plane, a rapidly obtained spatial change in touch force on the X-Y plane allows whether the touch force is caused by a user's intention, an error or another reason to be easily identified. Furthermore, a gesture based on a user's intention may be easily recognized by tracking a spatial change in touch force on the X-Y plane in a time domain.

Referring to the inductive touch force sensor 200 of FIG. 2 and the circuit of FIG. 7 together, the inductive touch force sensor 200 or 700 according to the embodiment of the present invention includes: the first channel resonance circuit 720 coupled to the first inductive coil of the plurality of inductive coils 212 or 712, and configured to have the first resonant frequency $\omega 1$ attributable to the first inductance formed in the first inductive coil based on the first displacement of the target layer 240 or 740 relative to the first inductive coil; the first oscillator 722 configured to apply a first AC signal to the first channel resonance circuit 720; the second channel resonance circuit (not shown) coupled to the second inductive coil of the plurality of inductive coils 212 or 712, and configured to have the second resonant frequency $\omega 2$ attributable to the second inductance formed in the second inductive coil based on the second displacement of the target layer 240 or 740 relative to the second inductive coil; the second oscillator (not shown) configured to apply a second AC signal to the second channel resonance circuit; a reference resonance circuit configured to have the same impedance as a predetermined first state of the states that the first channel resonance circuit 720 can have and a predetermined second state of the states that the second channel resonance circuit can have; the reference oscillator configured to have the same characteristics as the first oscillator 722 and the second oscillator and to apply a reference AC signal to the reference resonance circuit; and the determination circuit 770 configured to receive a first electric signal formed in the first channel resonance circuit 720, a second electric signal formed in the second channel resonance circuit, and a reference electric signal formed in the reference resonance circuit, and to determine the first displacement, the second displacement, the location at which the external force 750 in the Z-axis direction has been input, and the external force 750 based on the first resonant frequency $\omega 1$ of the first electric signal, the second resonant frequency $\omega 2$ of the second electric signal, and the reference resonant frequency $\omega\_ref$ of the reference electric signal.

The determination circuit 770 of the inductive touch force sensor 200 or 700 according to the embodiment of the present invention may sense the difference between the reference resonant frequency $\omega\_ref$ of the reference electric signal, formed in the reference resonance circuit by the influence of the reference AC signal that is applied to the reference resonance circuit, and the first resonant frequency $\omega 1$, may obtain quantified sensing information about the extent to which the first channel resonance circuit 720 deviates from the first state, the first displacement of the target 240 or 740, and the external force 750 in the Z-axis direction appearing in a first separated area corresponding to the first inductive coil based on the difference between the reference resonant frequency $\omega\_ref$ and the first resonant frequency $\omega 1$, may sense the difference between the reference resonant frequency $\omega\_ref$ and the second resonant frequency $\omega 2$, and may obtain quantified sensing information about the extent to which the second channel resonance circuit deviates from the second state, the second displacement of the target 240 or 740, and the external force 750 in the Z-axis direction appearing in a second separated area corresponding to the second inductive coil based on the difference between the reference resonant frequency $\omega\_ref$ and the second resonant frequency $\omega 2$.

When at least one of the difference between the reference resonant frequency $\omega\_ref$ and the first resonant frequency $\omega 1$ and the difference between the reference resonant frequency $\omega\_ref$ and the second resonant frequency $\omega 2$ is equal to or larger than a first threshold value, the determination circuit 770 of the inductive touch force sensor 200 or 700 according to the embodiment of the present invention may sense/consider that at least one of the first resonant frequency $\omega 1$ and the second resonant frequency $\omega 2$ has caused a significant change and thus determine that the external forces 750 in the Z-axis direction have been input.

Referring to the inductive touch force sensor 300 of FIG. 3 and the circuit of FIG. 7 together, the determination circuit 770 of the inductive touch force sensor 300 or 700 according to the embodiment of the present invention may recognize quantified sensing information about the external force 750 in the Z-axis direction in the first area facing or covered by the first inductive coil, quantified sensing information about the external force 750 in the Z-axis direction in the second area facing or covered by the second inductive coil, and a user gesture intended by the external forces 750 in the Z-axis direction based on the first change pattern of the difference between the reference resonant frequency $\omega\_ref$ and the first resonant frequency $\omega 1$ in the time domain and the second change pattern of the difference between the reference resonant frequency $\omega\_ref$ and the second resonant frequency $\omega 2$ in the time domain.

In this case, even when a determination circuit is not allocated to each of the coils 312 of the single module 310*a* but a single determination circuit is allocated to the single module 310*a*, the inductance distribution of the individual coils 312 may be sufficiently measured without a substantial time difference.

Referring to the inductive touch force sensor 400 of FIG. 4 and the circuit of FIG. 7 together, the determination circuit 770 of the inductive touch force sensor 400 or 700 according to the embodiment of the present invention may extract quantified sensing information about the external force 750 in the Z-axis direction in the first area facing or covered by the first inductive coil and quantified sensing information about the external force 750 in the Z-axis direction in the second area facing or covered by the second inductive coil and determine whether or not the external forces in the Z-axis direction are input intended by a user based on the difference between the reference resonant frequency $\omega\_ref$ and the first resonant frequency $\omega 1$ and the difference between the reference resonant frequency $\omega\_ref$ and the second resonant frequency $\omega 2$.

In this case, even when a determination circuit is not allocated to each of the coils 412 of the single module 410*a* but a single determination circuit is allocated to the single module 410*a*, the inductance distribution of the individual coils 412 may be sufficiently measured without a substantial time difference.

Referring to the inductive touch force sensor 500 of FIG. 5 and the circuit of FIG. 7 together, the determination circuit 770 of the inductive touch force sensor 500 or 700 according to the present embodiment of the present invention may recognize quantified sensing information about the external force 750 in the Z-axis direction in the channel area 514 facing or covered by the inductive coil 512 and a user gesture intended by the external force 750 in the Z-axis direction based on the change pattern of the difference between the reference resonant frequency $\omega\_ref$ and the first resonant frequency $\omega 1$ in the time domain. In other words, a change in the location of the external force 750 on the X-Y plane may be recognized even within the single channel area 514, and a gesture intended by a user may be recognized by tracking a change in the location of the external force 750 on the X-Y plane in the time domain.

Figure 8:
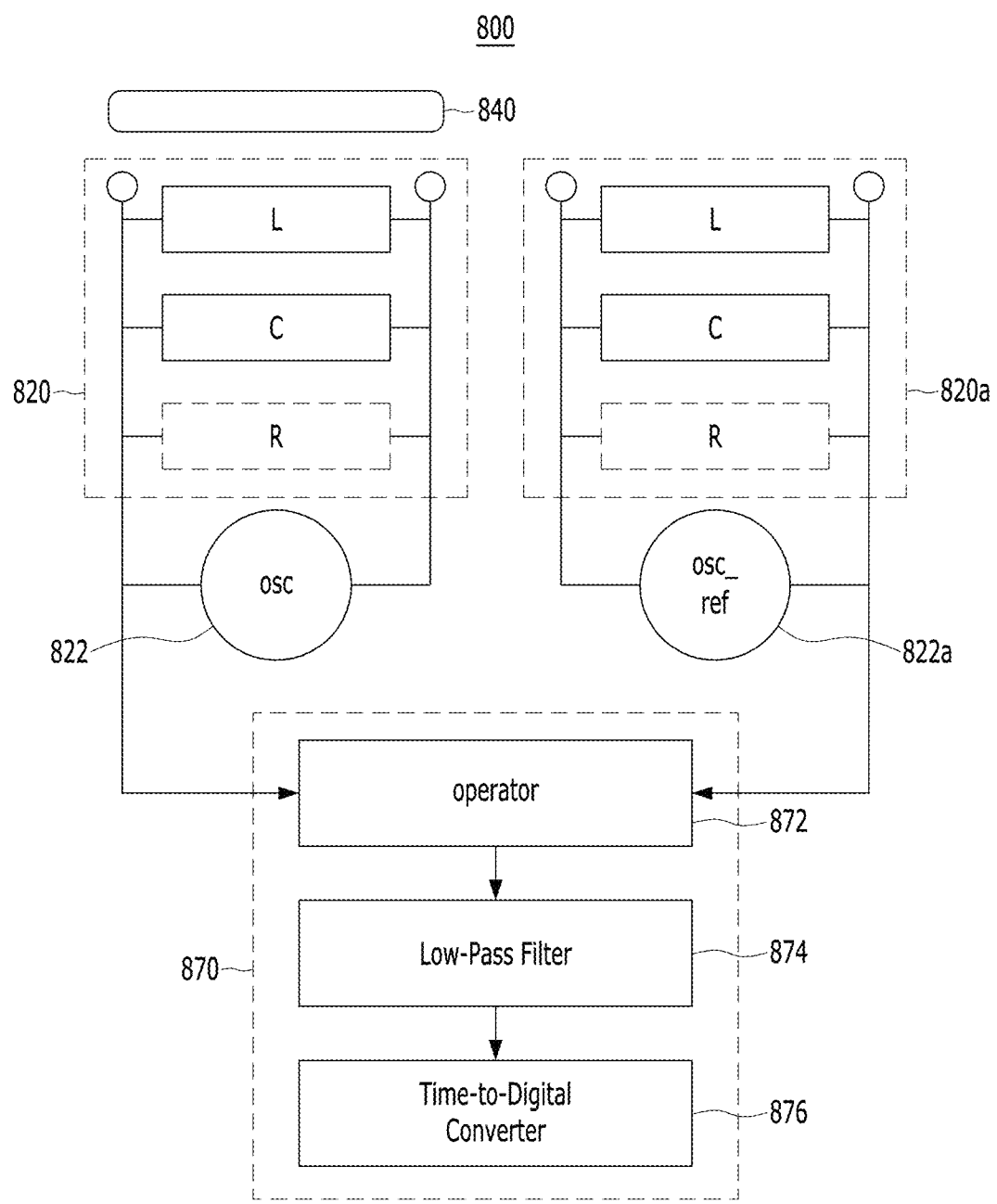
FIG. 8 is a view showing the circuit of an inductive touch force sensor and a method of operating the same according to an embodiment of the present invention.

FIG. 8 is a view showing the circuit of an inductive touch force sensor 800 and a method of operating the same according to an embodiment of the present invention.

Referring to FIG. 1 and FIG. 8 together, the inductive touch force sensor 100 or 800 according to the embodiment of the present invention includes a first resonance circuit 820, a first oscillator 822, a reference resonance circuit 820a, and a reference oscillator 822a. Since the operations of the first resonance circuit 820, first oscillator 822, reference resonance circuit 820a and reference oscillator 822a of FIG. 8 are similar to those of the embodiment of FIG. 7, redundant descriptions thereof will be omitted.

The determination circuit 870 of the inductive touch force sensor 100 or 800 according to the embodiment of the present invention may include: an operator 872 configured to obtain the difference between the first resonant frequency $\omega 1$ and the reference resonant frequency $\omega\_ref$, a low-pass filter 874 connected to the output terminal of the operator 872, and configured to remove a high-frequency component; and a time-to-digital converter 876 connected to the output terminal of the low-pass filter 874, and configured to digitally count the frequency of a differential frequency component signal corresponding to the difference between the first resonant frequency $\omega 1$ and the reference resonant frequency $\omega\_ref$ (i.e., to output a digitized value proportional to the frequency of the differential frequency component signal).

The operator 872 may immediately obtain the differential frequency component signal using arithmetic operations (addition, subtraction, and multiplication) between the first electrical signal and the reference electrical signal. The time-to-digital converter 876 may count the number of pulses of a pulse signal having a differential frequency (or a frequency proportional to the differential frequency) for a predetermined time interval, or may generate a digital count value for the pulse width or period of a pulse signal having a differential frequency (or a frequency proportional to the differential frequency).

In an embodiment of the determination circuit 870, a sampler and comparator for a differential frequency component signal may be included. In this case, for the smooth operation of the determination circuit 870, the sampler and the comparator may be designed by selecting an operating frequency that is sufficiently higher than the first threshold value and the operating range of a resonant frequency component corresponding to sensing target displacement.

In this case, the reference resonance circuit 820a is managed to be blocked from an external influence and continuously maintain initialized settings.

Referring to the inductive touch force sensor 200 of FIG. 2 and FIG. 8 together, the determination circuit 870 of the inductive touch force sensor 200 or 800 according to the embodiment of the present invention may include: an operator 872 configured to obtain the difference between the first resonant frequency $\omega 1$ and the reference resonant frequency $\omega\_ref$ and to obtain the difference between the second resonant frequency $\omega 2$ and the reference resonant frequency $\omega\_ref$, a low-pass filter 874 connected to the output terminal of the operator 872, and configured to remove a high-frequency component; and a time-to-digital converter 876 connected to the output terminal of the low-pass filter 874, configured to digitally count the frequency of a differential frequency component signal corresponding to the difference between the first resonant frequency $\omega 1$ and the reference resonant frequency $\omega\_ref$, and to digitally count the frequency of a differential frequency component signal corresponding to the difference between the first resonant frequency $\omega 2$ and the reference resonant frequency $\omega\_ref$.

When pluralities of inductive coils 212 and channels are included, one resonance circuit may be included for each inductive coil 212 and channel. Even when the pluralities of inductive coil 212 and channels are included, the reference resonance circuit 820a and the determination circuit 870 do not need to be additionally included. The determination circuit 870 receives electric signals from the plurality of respective inductive coils 212 and channels via a time multiplexing technique, and detects the difference between each of the channel resonance frequencies of the received electric signals of the respective channels and the reference resonant frequency $\omega\_ref$, thereby detecting the inductance of each channel, displacement generated in each channel, and a touch force generated in each channel. Although not shown in the drawings, data on the inductance of each channel, the displacement generated in each channel, and the touch force generated in each channel, which are detected by the determination circuit 870, may be stored in memory or storage in association with channel identification information that enables each channel to be identified.

In the embodiments of the present invention, the determination circuit 770 or 870 may immediately obtain the differential frequency component between the resonant frequency of each channel and the reference resonant frequency $\omega\_ref$, and thus the inductances, displacements and touch forces of a plurality of channels may substantially simultaneously be identified without a time delay.

In the embodiments of the present invention, the resonant frequency information of each channel may be detected by the determination circuit 770 or 870 independently of the amplitudes of the electric signal of each channel and the reference electric signal (without detecting the amplitudes thereof). In this case, in an embodiment, conventional techniques for detecting amplitudes independently of a resonant frequency may be applied in parallel, and two pieces of sensing information (first sensing information based on the detection of amplitudes, and second sensing information based on the detection of a resonant frequency independently of amplitudes) obtained independently of each other may be cross-verified.

Figure 9:
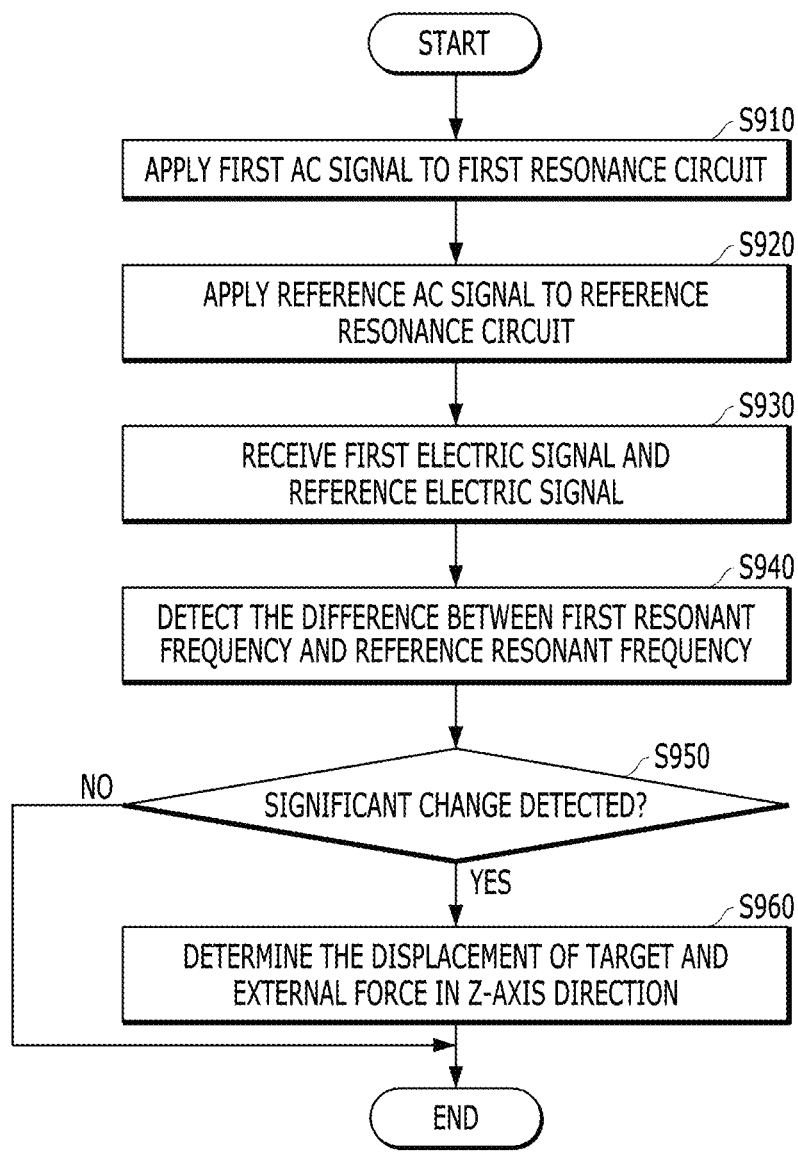
FIG. 9 is an operation flowchart showing a method of operating an inductive touch force sensor according to an embodiment of the present invention.

FIG. 9 is an operation flowchart showing a method of operating an inductive touch force sensor according to an embodiment of the present invention.

The operation method of FIG. 9 may be performed by the inductive touch force sensor 100, 700 or 800 for which reference is made to FIGS. 1, 7 and 8 together.

The method of operating the inductive touch force sensor 100, 700 or 800 according to the present embodiment includes: step S910 of applying, by the first oscillator 722 or 822, a first AC signal to the first resonance circuit 720 or 820 that is coupled to the inductive coil 112 or 712 and has a first resonant frequency $\omega 1$ attributable to first inductance due to the inductive coil 112 or 712 based on the displacement of the target 140, 740 or 840 relative to the inductive coil 112 or 712; step S920 of applying, by the reference oscillator 822a having the same characteristics as the first oscillator 722 or 822, a reference AC signal to the reference resonance circuit 820a that has the same impedance as a predetermined first state of the states that the first resonance circuit 720 or 820 can have; step S930 of receiving, by the determination circuit 770 or 870, a first electric signal that is formed in the first resonance circuit 720 or 820 by the influence of the first AC signal; step S930 of receiving, by the determination circuit 770 or 870, a reference electric signal that is formed in the reference resonance circuit 820a; and step S960 of determining, by the determination circuit 770 or 870, the displacement of the target 140, 740 or 840 and the external force 150, 750 in the Z-axis direction based on the first resonant frequency $\omega 1$ of the first electric signal and the reference resonant frequency $\omega\_ref$ of the reference electric signal.

In this case, the determination circuit 770 or 870 may perform step S940 of detecting the difference between the reference resonant frequency $\omega\_ref$ and the first resonant frequency $\omega 1$, and step S960 of obtaining quantified sensing information about the extent to which the first resonance circuit 720 or 820 deviates from the first state, the displacement of the target 140, 740 or 840 relative to the inductive coil 112 or 712, and the external force 150 or 750 in the Z-axis direction based on the result of step S940.

In this case, the determination circuit 770 or 870 may perform step S950 of determining whether or not a significant change has been sensed by determining whether or not the result of step S940 exceeds a first threshold value.

A method of operating the inductive touch force sensor 500, 700 or 800 according to another embodiment of the present invention may further include the step of recognizing, by the determination circuit 770 or 870, quantified sensing information about the external force 750 in the Z-axis direction in the channel area 514 facing or covered by the inductive coil 512 or 712 and a user gesture supposed to be intended by a user based on the external force 750 in the Z-axis direction, based on the change pattern of the difference between the reference resonant frequency $\omega\_ref$ and the first resonant frequency $\omega 1$ in the time domain.

Figure 10:
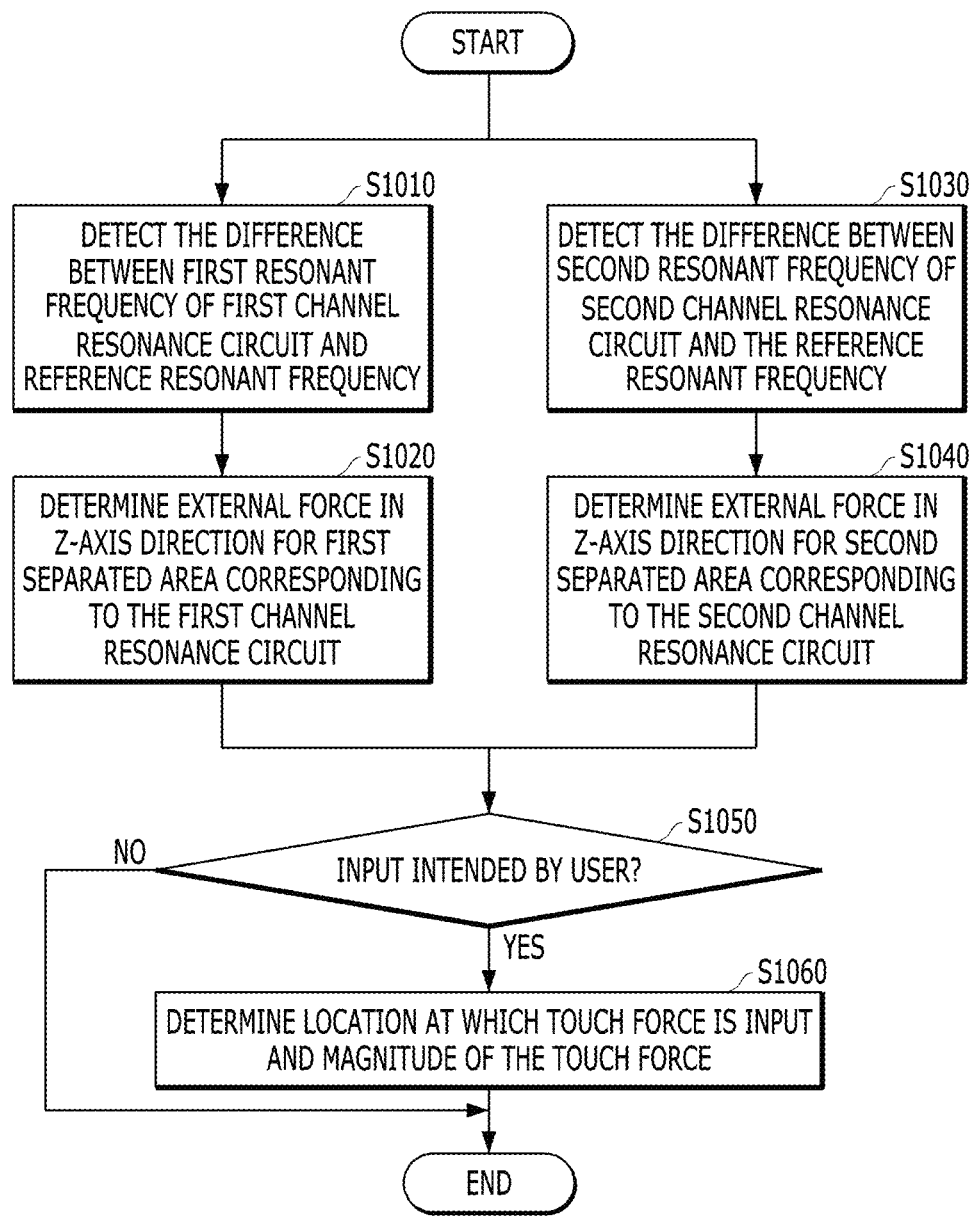
FIG. 10 is an operation flowchart showing a method of operating an inductive touch force sensor according to an embodiment of the present invention.

FIG. 10 is an operation flowchart showing a method of operating an inductive touch force sensor according to an embodiment of the present invention.

The operation method of FIG. 10 may be performed by the inductive touch force sensor 200, 700 or 800 for which reference is made to FIGS. 2, 7 and 8 together.

In the method of operating the inductive touch force sensor 200, 700 or 800 according to the present embodiment, steps S910 to S930 of FIG. 9 are performed for a first channel, in which case particularly, the determination circuit 770 or 870 performs step S930. Furthermore, steps S910 to S930 of FIG. 9 are separately performed for a second channel.

The determination circuit 770 or 870 performs step S1020 or S1040 of determining the first displacement, the second displacement, the location at which the external force in the Z-axis direction has been input, and the external force based on the first resonant frequency of the first electric signal, the second resonant frequency of the second electric signal, and the reference resonant frequency of the reference electric signal.

In this case, the step of determining, by the determination circuit 770 or 870, the location at which the external force in the Z-axis direction has been input and the external force may include: step S1010 of detecting the difference between the reference resonant frequency and the first resonant frequency; step S1030 of detecting the difference between the reference resonant frequency and the second resonant frequency; step S1020 or S1060 of obtaining quantified sensing information about the extent to which the first resonance circuit deviates from the first state, the first displacement of the target, and the external force in the Z-axis direction appearing in a first separated area corresponding to the first inductive coil based on the difference between the reference resonant frequency and the first resonant frequency; and step S1040 or S1060 of obtaining quantified sensing information about the extent to which the second resonance circuit deviates from the second state, the second displacement of the target, and the external force in the Z-axis direction appearing in a second separated area corresponding to the second inductive coil based on the difference between the reference resonant frequency and the second resonant frequency.

At step S1050, the determination circuit 770 or 870 determines whether or not the sensed touch forces correspond to the input intended by a user and whether or not the sensed touch forces correspond to a signal fluctuation attributable to an error or another factor unintended by the user for the first and second channels based on the results of steps S1020 and S1040.

If, as a result of step S1050, it is determined that the sensed touch forces correspond to the input intended by the user, the determination circuit 770 or 870 digitizes and quantifies the location at which the touch force has been input and the magnitude of the touch force for an area including the first and second channels at step S1060.

Figure 11:
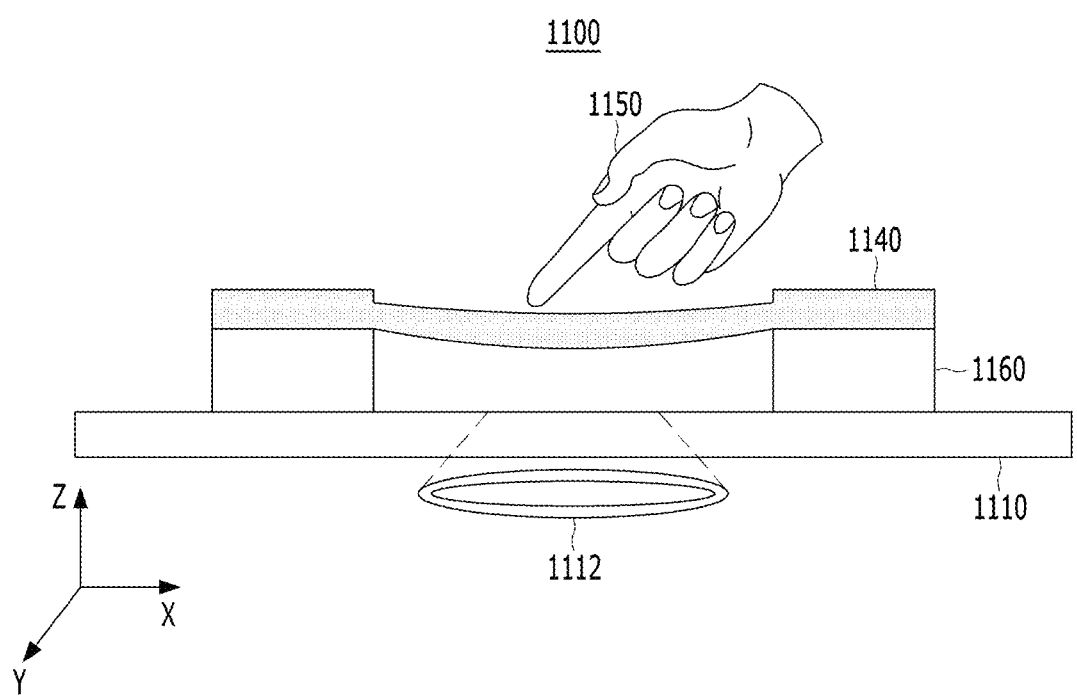
FIG. 11 is a view showing an inductive touch force sensor according to an embodiment of the present invention.

FIG. 11 is a view showing an inductive touch force sensor 1100 according to an embodiment of the present invention. In FIG. 11, there is shown the inductive touch force sensor 1100 in which a single button, channel and coil are assumed.

FIG. 11 shows an embodiment modified such that the first part 1140 of FIG. 11 performs the functions of the target layer 140 and first part 130 of the embodiment shown in FIG. 1. In other words, in FIG. 11, a separate target layer is not present, and the displacement in a Z-axis direction attributable to the deformation of the first part 1140 may be detected via a change in inductance and a change in resonant frequency that are caused by the inductive coupling between an inductive coil 1112 and the first part 1140.

Since the external force 1150, substrate 1110 and spacer layer 1160 of FIG. 11 are the same as the external force 150, substrate 110 and spacer layer 160 of FIG. 1, redundant descriptions thereof will be omitted.

The conventional inductive sensing technologies are difficult to accurately measure the displacement of the first part 1140 in the Z-axis direction caused by the external force 1150. Accordingly, in an effort to increase the accuracy of measurement, the target layer 140 is additionally disposed under the first part 130, as shown in FIG. 1, and displacement is sensed when the target layer 140 is displaced in the Z-axis direction based on the deformation of the first part 130 in the Z-axis direction. However, in the embodiment of the present invention, the change in inductance is detected through the difference in the resonance frequency of the differential signal, and thus the quantification and digitization of a measured value are easy and sensitivity to displacement is high. Accordingly, as shown in FIG. 11, the external force 1150 in the Z-axis direction may be sensed and quantified only with the single first part 1140. In this case, the inductance of a resonance circuit connected to the inductive coil 1112 by the inductive coupling between the first part 1140 and the inductive coil 1112 varies depending on the distance between the first part 1140 and the inductive coil 1112 in the Z-axis direction. Accordingly, a change in inductance and a change in resonant frequency may be detected only by the displacement of the first part 1140 in the Z-axis direction, and the external force 1150 in the Z-axis direction may be sensed and quantified. In this case, when the first part 1140 is deformed and an eddy current is induced in a portion closer to the inductive coil 1112, a change in synthetic inductance attributable to the displacement of the first part 1140 in the Z-axis direction is detected. Accordingly, the first part 1140 may be implemented to have electrical conductivity.

Figure 12:
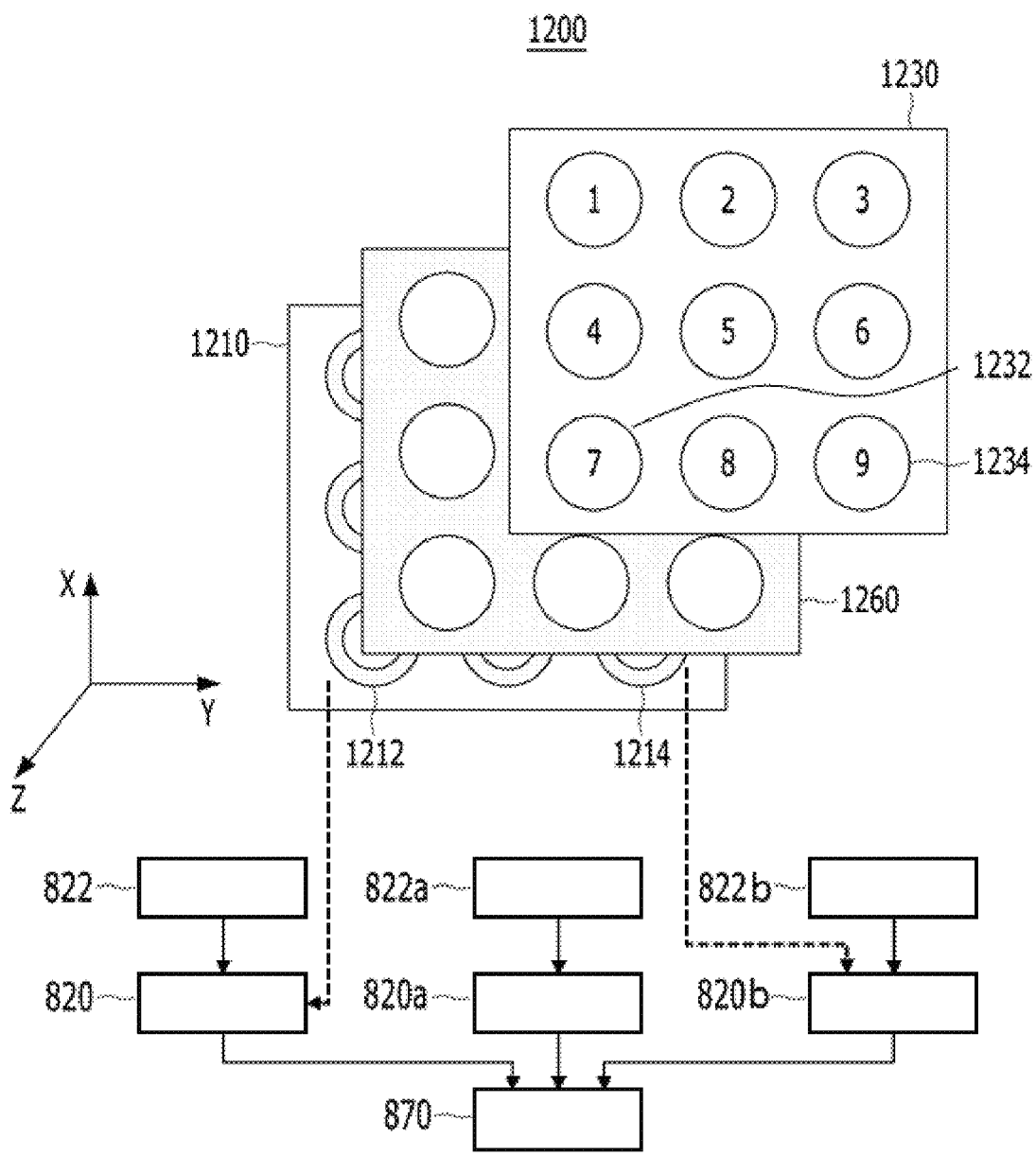
FIG. 12 is a view showing an inductive touch force sensor according to an embodiment of the present invention.

FIG. 12 is a view showing an inductive touch force sensor 1200 according to an embodiment of the present invention.

FIG. 12 shows an embodiment modified such that the second part 1230 of FIG. 12 performs the functions of the target layer 240 and second part 230 of the embodiment shown in FIG. 2. In other words, in FIG. 12, a separate target layer is not present, and the displacement in the Z-axis direction attributable to the deformation of separated areas 1232 within the second part 1230 may be detected through a change in inductance and a change in resonant frequency that are caused by the inductive coupling between a plurality of inductive coils 1212 and the separated areas 1232 and 1234 within the second part 1230.

Since the substrate 1210 and spacer layer 1260 of FIG. 12 are the same as the substrate 210 and spacer layer 260 of FIG. 2, redundant descriptions thereof will be omitted.

The conventional inductive sensing technologies are difficult to accurately measure the displacement of each of the separated areas 1232 and 1234 within the second part 1230 in the Z-axis direction caused by an external force. Accordingly, in an effort to increase the accuracy of measurement, the target layer 240 is additionally disposed under the second part 230, as shown in FIG. 2, and displacement is sensed when the target layer 240 is displaced in the Z-axis direction based on the deformation of the second part 230 in the Z-axis direction. However, in the embodiment of the present invention, the change in inductance is detected through the difference in the resonance frequency of a differential signal, and thus the quantification and digitization of measured values are easy and sensitivity to displacement is high. Accordingly, as shown in FIG. 12, a target layer is not disposed, and the displacement of each of the separated areas 1232 and 1234 may be detected and quantified by the inductive coupling between the separated areas 1232 and 1234 within the second part 1230 and the plurality of inductive coils 1212 and 1214.

When the first separated area 1232 of the separated areas is deformed by applying an external force to the first separated area 1232 and the first separated area 1232 is displaced in the Z-axis direction, whether or not the external force is applied to the first inductive coil 1212 of the plurality of inductive coils opposite to the first separated area 1232 and the magnitude of the external force may be determined based on a change in inductance that is detected in the first inductive coil 1212. The displacement in the Z-axis direction in the first separated area 1232 (the deformation and displacement in the Z-axis direction of the first separated area 1232 relative to the first inductive coil 1212) affects the inductance of the first resonance circuit 820 to which the first inductive coil 1212 is connected due to the inductive coupling between the first inductive coil 1212 and the first separated area 1232. Based on the changed inductance of the first resonance circuit 820 with the first oscillator 822, a change in the first resonant frequency $\omega 1$ of the first resonance circuit 820 is sensed by the determination circuit 770 or 870 based on the difference between the reference resonant frequency $\omega\_ref$ (of the reference resonance circuit 820a with the reference oscillator 822a) and the first resonant frequency $\omega 1$, and a change in first resonant frequency $\omega 1$ is quantified based on the difference between the reference resonant frequency $\omega\_ref$ and the first resonant frequency $\omega 1$. The quantified change in first resonant frequency $\omega 1$ may be digitized and stored in separate memory or storage. When the second separated area 1234 is deformed by applying the external force to the second separated 1234 and the second separated area 1234 is displaced in the Z-axis direction in relative to a second inductive coil 1214, a change in second resonant frequency of a second resonance circuit 820b with a second oscillator 822b can be quantified based on the difference between the reference resonant frequency and the second resonant frequency by the determination circuit 770 or 870 in a similar manner. The second resonance circuit 820b and the second oscillator 822b operate in a similar manner as the first resonance circuit 820 and the first oscillator 822 described with respect to FIG. 8.

In this case, the inductance of a resonance circuit connected to each of the inductive coils 1212 is changed by the inductive coupling between the separated areas 1232 within the second part 1230 and the opposite inductive coils 1212. Accordingly, a change in inductance and a change in resonant frequency may be detected only by the displacement of the separated areas 1232 in the Z-axis direction, and the external force in the Z-axis direction may be sensed and quantified. In this case, when an eddy current is induced in a portion of the separated areas 1232 within the second part 1230 moved closer to the inductive coils 1212 by the external force, a change in synthetic inductance attributable to the displacement in the Z-axis direction is detected. When the separated areas 1232 are implemented such that an eddy current is easily induced, a change in synthetic inductance is more clearly exhibited, and thus the sensitivity of the sensor may be improved. In this case, in order to allow an eddy current to be easily induced in the separated areas 1232 within the second part 1230, the separated areas 1232 within the second part 1230 may be implemented to have higher electrical conductivity than the remaining areas. For example, a thin metal film, such as a thin aluminum film, which is both a non-magnetic material and an electrical conductor, is disposed in each of the separated areas 1232, thereby increasing the electrical conductivity of the separated areas 1232 and also improving sensitivity to the displacement of the separated areas 1232 in the Z-axis direction.

Figure 13:
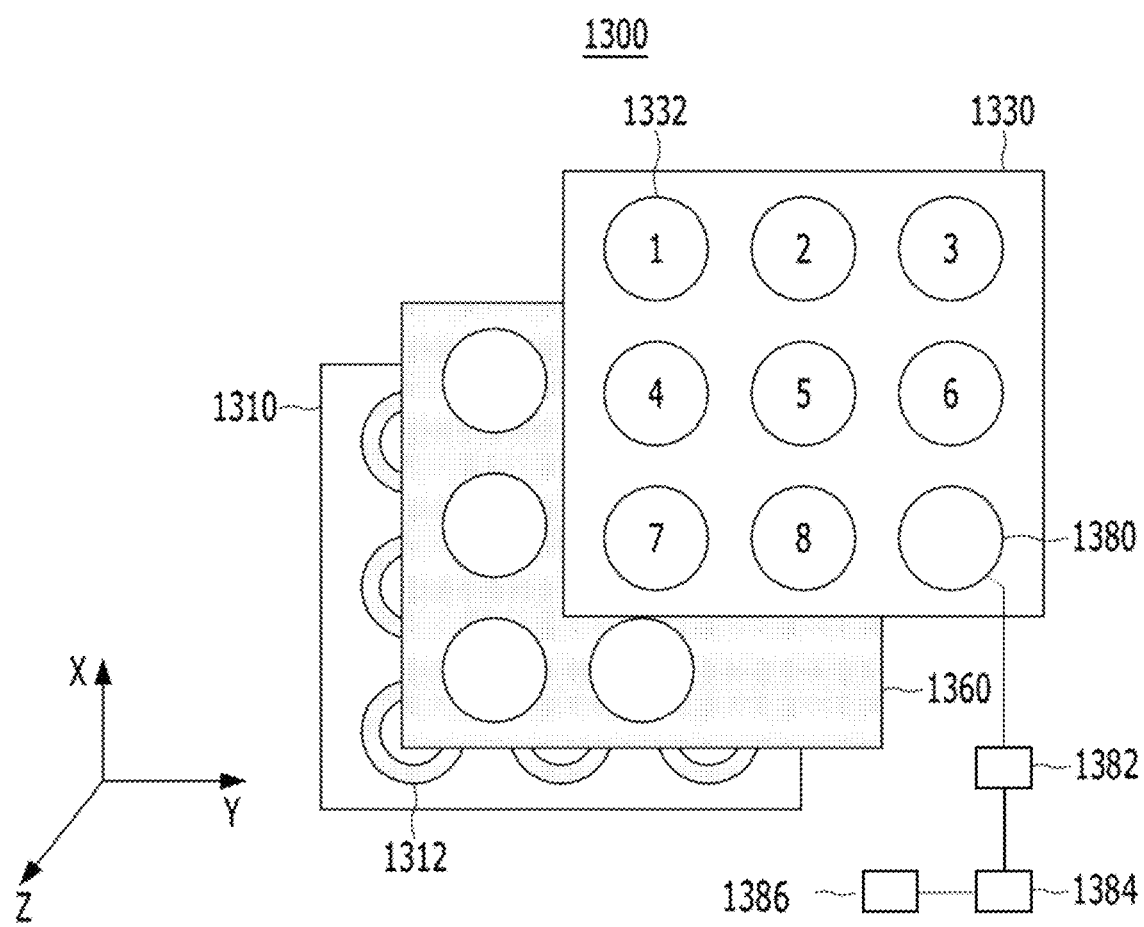
FIG. 13 is a view showing an electronic device including an inductive touch force sensor and a power-on button according to an embodiment of the present invention.

FIG. 13 is a view showing an electronic device 1300 including an inductive touch force sensor and a power-on button according to an embodiment of the present invention.

As described above, if a cutout-free enclosure is implemented, a high IP rating may be implemented, and also a wearable device having a high IP rating may be utilized for various purposes for which a previous wearing device is not utilized. When a wearable device uses neither a gasket nor moving parts, the wearable device may be physically more robust. For example, such an electronic device may be embedded in wearable items such as gloves, and may also be utilized underwater.

When the embodiments of FIGS. 7 and 8 are applied to the embodiment of FIG. 13, the electronic device 1300 according to the present embodiment includes: an enclosure 1330 configured to surround the interior of the electronic device 1300; a first area 1380 disposed on the enclosure 1330, and configured to operate as a power-on button; and a plurality of second areas 1332 arranged to be elastically deformable in a Z-axis direction by an external force applied in the Z-axis direction in the remaining areas of the enclosure 1330 excluding the first area 1380. A pressure-sensing variable resistor 1382 configured to respond to pressure from the outside is disposed in the first area 1380, and the pressure-sensing variable resistor 1382 and the internal power 1386 of the electronic device 1300 are connected to a power-on button on/off sensing circuit 1384. A plurality of inductive coils 1312, 712 disposed to be spaced apart from the second areas 1332 and to be opposite to the respective second areas 1332 inside the electronic device 1300 may form individual channel resonance frequencies ω_i deviating from the reference resonant frequency ω_ref based on individual channel displacements Δd_i by which the second areas 1332 are elastically deformed in the Z-axis direction by an external force applied in the Z-axis direction, and the determination circuit 770 or 870 may determine the individual channel displacements Δd_i and external forces F_i applied in the Z-axis direction to the second areas 1332 based on the individual channel resonant frequencies ω_i.

Since the substrate 1310 of FIG. 13 is the same as the substrate 1210 of FIG. 12 and the substrate 210 of FIG. 2 and the spacer layer 1360 of FIG. 13 is the same as the spacer layer 1260 of FIG. 12 and the spacer layer 260 of FIG. 2, redundant descriptions thereof will be omitted.

In FIG. 13, there is not shown a target layer. In the case where there is no target layer, the individual channel displacements Δd_i refer to the displacements of the second areas 1332 having elasticity in the Z-axis direction. Variations in the distances d_i between the second areas 1332 having elasticity and the plurality of inductive coils 1312 or 712 in the Z-axis direction may be defined as the individual channel displacements Δd_i.

It will be apparent to those skilled in the art that the target layer 140 or 240 may be disposed in contact with the second regions 1332 in another embodiment of the present invention in which the embodiments of FIGS. 1 and 2 are applied to the embodiment of FIG. 13.

Referring back to FIGS. 13, 7 and 8, the plurality of individual channel resonance circuits 720 or 820 is coupled to the plurality of inductive coils 1312 or 712, respectively, and has individual channel resonant frequencies ω_i attributable to individual channel inductances formed in the plurality of inductive coils 1312 or 712 based on the individual channel displacements Δd_i of the plurality of second areas 1332 in the Z-axis direction relative to the plurality of inductive coils 1312 or 712. The reference resonant circuit 820a is set to have the same impedance as a predetermined first state of the states that the plurality of individual channel resonance circuits 720 or 820 can have. In this case, on the assumption that the first state corresponds to a case where external forces F_i applied to the plurality of second areas 1332 in the Z-axis direction are 0, the reference resonance circuit 820a and the plurality of individual channel resonance circuits 720 or 820 may be designed.

The determination circuit 770 or 870 may receive a reference electric signal formed in the reference resonance circuit 820a by the influence of a reference AC signal applied to the reference resonance circuit 820a and a plurality of individual channel electric signals formed in the plurality of individual channel resonance circuits 720 or 820 by the influence of individual channel AC signals applied to the plurality of individual channel resonance circuits 720 or 820, and the individual channel displacements Δd_i, and may determine the locations at which external forces F_i applied in the Z-axis direction have been input in the plurality of second areas 1332 and the external forces F_i applied in the Z-axis direction based on the reference resonant frequency ω_ref of the reference electric signal and the individual channel resonant frequencies ω_i of the plurality of individual channel electric signals.

When a change in the resistance value of the pressure-sensing variable resistor 1382 attributable to pressure on the first area 1380 from the outside is equal to or larger than a first threshold value, the power-on button on/off sensing circuit 1384 may perform control so that the internal power is applied to the plurality of inductive coils 1312 or 712, the plurality of individual channel resonance circuits 720 or 820, the reference resonance circuit 820a, and the determination circuit 770 or 870.

The pressure-sensing variable resistor 1382 may be implemented using a well-known material, e.g., Velostat or Lingstat that is known as a pressure-sensitive conductive sheet. In this case, the power-on button on/off sensing circuit 1384 may be implemented such that when pressure in the Z-axis direction is applied to the pressure-sensing variable resistor 1382, the resistance value of the pressure-sensing variable resistor 1382 is lowered, and thus the switch of the power-on button on/off sensing circuit 1384 is turned on.

When the resistance value of the pressure-sensing variable resistor 1382 is lowered and thus a change in the resistance value from an OFF state is equal to or larger than a first threshold value, there occurs a switching operation in which the switch blocked in the power-on button on/off sensing circuit 1384 is turned on, and the power-on button on/off sensing circuit 1384 may control a peripheral circuit for the internal power in response to the switching operation so that the internal power is applied to the plurality of inductive coils 1312 or 712, the plurality of individual channel resonance circuits 720 or 820, the reference resonance circuit 820a, and the determination circuit 770 or 870.

The determination circuit 770 or 870 may obtain quantified sensing information about the extents to which the plurality of individual channel resonance circuits 720 or 820 deviates from the first state, the individual channel displacements Δd_i of the plurality of second areas 1332 in the Z-axis direction, and the external forces F_i applied to the plurality of second areas 1332 in the Z-axis direction based on the extents to which the individual channel resonant frequencies ω_i of the plurality of the individual channel resonance circuits 720 or 820 deviate from the reference resonant frequency ω_ref.

When the embodiment of FIG. 9 is applied to the embodiment of FIG. 13 and when the extent to which a first individual channel resonant frequency ω1 of the individual channel resonant frequencies ω_i of the plurality of individual channel resonance circuits 720 or 820 deviates from the reference resonant frequency ω_ref is equal to or larger than a second threshold value, the determination circuit 770 or 870 senses or considers that the first individual channel resonant frequency ω1 has caused a significant change and thus determines that an external force F1 applied in the Z-axis direction has been input to a first separated area corresponding a first individual channel resonance circuit in which the first individual channel resonant frequency ω1 is formed.

According to an embodiment of the present invention in which the embodiment of FIG. 5 or 6 is applied to the plurality of inductive coils 1312 or 712 of FIG. 13, the determination circuit 770 or 870 may recognize quantified sensing information about an external force F_i applied in the Z-axis direction to the first separated area facing or covered by a first inductive coil to which the first individual channel resonance circuit is coupled and a user gesture intended by the external force F_i applied in the Z-axis direction based on the change pattern of the difference between the reference resonant frequency ω_ref and the first individual channel resonant frequency ω1 appearing in the time domain.

According to an embodiment of the present invention in which the embodiments of FIGS. 3 and 10 are applied to the embodiment of FIG. 13, the determination circuit 770 or 870 may recognize quantified first sensing information about an external force F1 applied in the Z-axis direction to the first separated area facing or covered by the first inductive coil to which the first individual channel resonance circuit is coupled, quantified second sensing information about an external force F2 applied in the Z-axis direction to the second separated area facing or covered by the second inductive coil to which the second individual channel resonance circuit is coupled, and a user gesture intended by the external forces F1 and F2 applied in the Z-axis direction based on a first change pattern appearing in the time domain for the difference between the first individual channel resonant frequency $\omega 1$ of a first individual channel resonance circuit of the plurality of individual channel resonance circuits 720 or 820 and the reference resonant frequency $\omega\_ref$ and a second change pattern appearing in the time domain for the difference between the second individual channel resonant frequency $\omega 2$ of a second individual channel resonance circuit of the plurality of individual channel resonance circuits 720 or 820 and the reference resonant frequency $\omega\_ref$.

According to an embodiment of the present invention in which the embodiments of FIGS. 4 and 10 are applied to the embodiment of FIG. 13, the determination circuit 770 or 870 may extract quantified first sensing information about an external force F1 applied in the Z-axis direction to the first separated area facing or covered by a first inductive coil to which the first individual channel resonance circuit is coupled and quantified second sensing information about an external force F2 applied in the Z-axis direction to the second separated area facing or covered by a second inductive coil to which the second individual channel resonance circuit is coupled based on a first change pattern appearing in the time domain for the difference between the first individual channel resonant frequency $\omega 1$ of a first individual channel resonance circuit of the plurality of individual channel resonance circuits 720 or 820 and the reference resonant frequency $\omega\_ref$ and a second change pattern appearing in the time domain for the difference between the second individual channel resonant frequency $\omega 2$ of a second individual channel resonance circuit of the plurality of individual channel resonance circuits 720 or 820 and the reference resonant frequency $\omega\_ref$, and may determine whether or not the external forces F1 and F2 applied in the Z-axis direction are input intended by a user based on the first sensing information and the second sensing information.

Referring back to FIGS. 13, 7 and 8, the determination circuit 770 or 870 may include: an operator 872 configured to obtain quantified information about the extents to which the individual channel resonant frequencies $\omega\_i$ of the plurality of individual channel resonance circuits 720 or 820 deviate from the reference resonant frequency $\omega\_ref$, a low-pass filter 874 connected to the output terminal of the operator 872, and configured to remove a high-frequency component; and a time-to-digital converter 876 connected to the output terminal of the low-pass filter 874, and configured to digitally count the frequency of a differential frequency component signal corresponding to the extents to which the individual channel resonant frequencies $\omega\_i$ of the plurality of individual channel resonance circuits 720 or 820 deviate from the reference resonant frequency $\omega\_ref$.

The determination circuit 770 or 870 may perform a calibration process on the plurality of individual channel resonance circuits 720 or 820 based on quantified information about the extents to which the individual channel resonant frequencies $\omega\_i$ of the plurality of individual channel resonance circuits 720 or 820 deviate from the reference resonant frequency $\omega\_ref$ in the state in which forcible adjustment has been performed from the outside such that the plurality of individual channel resonance circuits 720 or 820 is in the first state.

According to the present invention, there may be implemented the electronic device having the cutout-free enclosure in which the plurality of user buttons is implemented as the inductive touch force sensor and recognizes various user gestures and the stable power-on button configured to operate the inductive touch force sensor is included.

In the case where the plurality of user buttons disposed on the enclosure configured to surround the interior of the electronic device is implemented as an inductive touch force sensor, internal power needs to be supplied to the inductive touch force sensor in advance in order to operate the inductive touch force sensor. In this case, turning on the internal power at all times will shorten the operating life of the electronic device, and thus a means for selectively turning on and off the internal power from the outside is required. The present invention may implement an electronic device including a power-on button configured to selectively and stably turn on and off internal power from the outside and user buttons implemented as an inductive touch force sensor, thereby providing an electronic device that has a long operating life and is applicable to various application ranges. The electronic device of the present invention is physically robust because it has a high IP rating. The electronic device of the present invention may be used even in an underwater environment, and may be applied to a wearable device even in a dusty or sweaty situation.

The method of operating a circuit according to an embodiment of the present invention may be implemented in the form of program instructions, and may be then recorded in a computer-readable storage medium. The computer-readable storage medium may include program instructions, data files, and data structures solely or in combination. Program instructions recorded on the storage medium may have been specially designed and configured for the present invention, or may be known to or available to those who have ordinary knowledge in the field of computer software. Examples of the computer-readable storage medium include all types of hardware devices specially configured to record and execute program instructions, such as magnetic media, such as a hard disk, a floppy disk, and magnetic tape, optical media, such as compact disk (CD)-read only memory (ROM) and a digital versatile disk (DVD), magneto-optical media, such as a floptical disk, ROM, random access memory (RAM), and flash memory. Examples of the program instructions include machine code, such as code created by a compiler, and high-level language code executable by a computer using an interpreter. These hardware devices may be configured to operate as one or more software modules in order to perform the operation of the present invention, and the vice versa.

However, the present invention is not limited to the embodiments. Like reference symbols in the drawings designate like components. The lengths, heights, sizes, widths, etc. introduced in the embodiments and drawings of the present invention may be exaggerated to help to understand.

According to the present invention, the inductive touch force sensor may be implemented using only an inductive sensor, thereby reducing hardware cost.

According to the present invention, even when the inductive touch force sensor is implemented using only the inductive sensor, a touch location, a touch force, a touch pattern, and a gesture may be accurately detected. In this case, the touch location and/or the touch force may be simultaneously represented by a single output value.

According to the present invention, a change in inductance may be detected using a single measurement without the scanning of a frequency component, thereby reducing power consumption and also shortening sensing time.

According to the present invention, a change in inductance may be accurately detected using a single measurement for each sensor without the scanning of a frequency component. Accordingly, even when an inductive sensor array or inductive sensor matrix is formed and operated, it is relatively free from the constraints of power consumption and sensing time, and various touch patterns, touch gestures and touch situations may be accurately determined using the array or matrix.

According to an embodiment of the present invention, a change in time domain may be detected and a gesture may be recognized using an inductive sensor having a single channel or coil.

According to an embodiment of the present invention, sensing results simultaneously obtained for a plurality of channels or coils may be combined together, and whether there is no error in the sensing results may be verified. Whether a touch force derived as a result of sensing is generated by a user's intention or an error by considering locational relationships between the sensing results simultaneously obtained for the plurality of coils and areas facing or covered by the coils.

The related arts sense the amplitude of a resonance signal or the amplitude or an analog AC signal, and thus only whether or not a detected result exceeds a predetermined threshold value. However, the present invention calculates the difference in the resonant frequency of a differential signal and digitally counts the calculated difference, and thus quantified sensing information may be obtained and a change in touch force in terms of time and space may be precisely sensed using the quantified sensing information.

According to the present invention, there may be implemented the electronic device having the cutout-free enclosure in which the plurality of user buttons is implemented as the inductive touch force sensor and recognizes various user gestures and the stable power-on button configured to operate the inductive touch force sensor is included.

In the case where the plurality of user buttons disposed on the enclosure configured to surround the interior of the electronic device is implemented as an inductive touch force sensor, internal power needs to be supplied to the inductive touch force sensor in advance in order to operate the inductive touch force sensor. In this case, turning on the internal power at all times will shorten the operating life of the electronic device, and thus a means for selectively turning on and off the internal power from the outside is required. The present invention may implement an electronic device including a power-on button configured to selectively and stably turn on and off internal power from the outside and user buttons implemented as an inductive touch force sensor, thereby providing an electronic device that has a long operating life and is applicable to various application ranges. The electronic device of the present invention is physically robust because it has a high IP rating. The electronic device of the present invention may be used even in an underwater environment, and may be applied to a wearable device even in a dusty or sweaty situation.

Although the present invention has been described with reference to specific details, such as the specific components, and the limited embodiments and drawings, these are provided merely to help a general understanding of the present invention, and the present invention is not limited thereto. Furthermore, those having ordinary knowledge and/or skill in the technical field to which the present invention pertains may make various modifications and variations from the above detailed description.

Therefore, the spirit of the present invention should not be defined based only on the described embodiments, and not only the attached claims but also all equivalent to the claims should be construed as falling within the scope of the spirit of the present invention.

What is claimed is:

1. An inductive force sensor comprising:
    a first part configured to:
        be exposed to an external force in a Z-axis direction; and
        be elastically deformable along the Z-axis direction by the external force in the Z-axis direction;
    an inductive coil formed on a substrate that is spaced apart from the first part;
    a first resonance circuit coupled to the inductive coil, and configured to generate a first electric signal having a first resonant frequency attributable to first inductance due to the inductive coil based on a displacement of the first part relative to the inductive coil;
    a first oscillator configured to apply a first alternating current (AC) signal to the first resonance circuit;
    a reference resonance circuit configured to have same impedance as a predetermined first state of states that the first resonance circuit has;
    a reference oscillator configured to:
        have same characteristics as the first oscillator; and
        apply a reference AC signal to the reference resonance circuit; and
    a determination circuit configured to:
        receive the first electric signal formed in the first resonance circuit;
        receive a reference electric signal formed in the reference resonance circuit; and
        determine the displacement of the first part and the external force in the Z-axis direction based on the first resonant frequency of the first electric signal and a reference resonant frequency of the reference electric signal.

2. The inductive force sensor of claim 1, wherein the determination circuit:
    detects a difference between the reference resonant frequency of the reference electric signal, formed in the reference resonance circuit by an influence of the reference AC signal that is applied to the reference resonance circuit, and the first resonant frequency; and
    obtains quantified sensing information about an extent to which the first resonance circuit deviates from the first state based on the difference between the reference resonant frequency and the first resonant frequency, the displacement of the first part relative to the inductive coil, and the external force in the Z-axis direction.

3. The inductive force sensor of claim 1, wherein when a difference between the reference resonant frequency and the first resonant frequency is equal to or larger than a first threshold voltage, the determination circuit senses that the first resonant frequency has caused a significant change and thus determines that the external force in the Z-axis direction has been input.

4. The inductive force sensor of claim 1, wherein the inductive coil is formed in such a manner that a plurality of elementary coils is arranged in a concentric overlapping structure.

5. The inductive force sensor of claim 1, wherein the inductive coil includes a set of a plurality of elementary coils, and the plurality of elementary coils has a structure in which a portion of each of the elementary coils is farther spaced apart from remaining portions as it becomes away from a specific location.

6. The inductive force sensor of claim 5, wherein the determination circuit recognizes quantified sensing information about the external force in the Z-axis direction in an area corresponding to the inductive coil and a user gestured intended by the external force in the Z-axis direction based on a change pattern of a difference between the reference resonant frequency and the first resonant frequency in a time domain.

7. The inductive force sensor of claim 1, wherein the determination circuit comprises:
   an operator circuit configured to obtain a difference between the first resonant frequency and the reference resonant frequency;
   a low-pass filter connected to an output terminal of the operator circuit, and configured to remove a high-frequency component; and
   a time-to-digital converter connected to an output terminal of the low-pass filter, and configured to digitally count a frequency of a differential frequency component signal corresponding to the difference between the first resonant frequency and the reference resonant frequency.

8. The inductive force sensor of claim 1, wherein the determination circuit performs a calibration process based on a difference between the first resonant frequency and the reference resonant frequency in a state forced externally such that the first resonance circuit is in the first state.

9. An inductive force sensor comprising:
   a second part including a plurality of separated areas configured to be exposed to an external force in a Z-axis direction and to be elastically deformable along the Z-axis direction by the external force in the Z-axis direction;
   a plurality of inductive coils formed on a substrate that is spaced apart from the second part, and disposed to correspond to the plurality of separated areas and to face the plurality of separated areas respectively;
   a first channel resonance circuit coupled to a first inductive coil of the plurality of inductive coils, and configured to generate a first electric signal having a first resonant frequency attributable to first inductance due to the first inductive coil based on a first displacement of a first separated area relative to the first inductive coil;
   a first oscillator configured to apply a first AC signal to the first channel resonance circuit;
   a second channel resonance circuit coupled to a second inductive coil of the plurality of inductive coils, and configured to have a second resonant frequency attributable to second inductance due to the second inductive coil based on a second displacement of a second separated area relative to the second inductive coil;
   a second oscillator configured to apply a second AC signal to the second channel resonance circuit;
   a reference resonance circuit configured to have same impedance as a predetermined first state of states that the first channel resonance circuit has and a predetermined second state of states that the second channel resonance circuit has;
   a reference oscillator configured to:
      have same characteristics as the first oscillator and the second oscillator; and
      apply a reference AC signal to the reference resonance circuit; and
   a determination circuit configured to:
      receive the first electric signal formed in the first channel resonance circuit, a second electric signal formed in the second channel resonance circuit, and a reference electric signal formed in the reference resonance circuit; and
      determine the first displacement, the second displacement, a location at which the external force in the Z-axis direction has been input, and the external force based on the first resonant frequency of the first electric signal, the second resonant frequency of the second electric signal, and a reference resonant frequency of the reference electric signal.

10. The inductive force sensor of claim 9, wherein the determination circuit:
    detects a difference between the reference resonant frequency of the reference electric signal, formed in the reference resonance circuit by an influence of the reference AC signal that is applied to the reference resonance circuit, and the first resonant frequency;
    obtains quantified sensing information about an extent to which the first channel resonance circuit deviates from the first state, the first displacement of the first separated area, and the external force in the Z-axis direction appearing in the first separated area corresponding to the first inductive coil based on the difference between the reference resonant frequency and the first resonant frequency;
    senses a difference between the reference resonant frequency and the second resonant frequency; and
    obtains quantified sensing information about an extent to which the second channel resonance circuit deviates from the second state, the second displacement of the second separated area, and the external force in the Z-axis direction appearing in the second separated area corresponding to the second inductive coil based on the difference between the reference resonant frequency and the second resonant frequency.

11. The inductive force sensor of claim 9, wherein the determination circuit recognizes quantified sensing information about the external force in the Z-axis direction in the first separated area corresponding to the first inductive coil, quantified sensing information about the external force in the Z-axis direction in the second separated area corresponding to the second inductive coil, and a user gesture intended by the external force in the Z-axis direction based on a first change pattern of a difference between the reference resonant frequency and the first resonant frequency in a time domain and a second change pattern of a difference between the reference resonant frequency and the second resonant frequency in the time domain.

12. The inductive force sensor of claim 9, wherein the determination circuit extracts quantified sensing information about the external force in the Z-axis direction in the first area corresponding to the first inductive coil and quantified sensing information about the external force in the Z-axis direction in the second separated area corresponding to the second inductive coil and determines whether or not the external force in the Z-axis direction is input intended by a user based on a difference between the reference resonant frequency and the first resonant frequency and a difference between the reference resonant frequency and the second resonant frequency.

13. The inductive force sensor of claim 9, wherein the determination circuit comprises:
an operator circuit configured to:
multiply the first resonant frequency and the reference resonant frequency; and
multiply the second resonant frequency and the reference resonant frequency;
a low-pass filter connected to an output terminal of the operator circuit, and configured to remove a high-frequency component; and
a time-to-digital converter connected to an output terminal of the low-pass filter, and configured to digitally count a frequency of a first differential frequency component signal corresponding to a difference between the first resonant frequency and the reference resonant frequency and to digitally count a frequency of a second differential frequency component signal corresponding to a difference between the second resonant frequency and the reference resonant frequency.

14. A method of operating an inductive force sensor, the inductive force sensor comprising a first part configured to be exposed to an external force in a Z-axis direction and to be elastically deformable along the Z-axis direction by the external force in the Z-axis direction and an inductive coil formed on a substrate that is spaced apart from the first part; the method comprising:
applying, by a first oscillator, a first AC signal to a first resonance circuit that is coupled to the inductive coil and generates a first electric signal having a first resonant frequency attributable to first inductance due to the inductive coil based on a displacement of the first part relative to the inductive coil;
applying, by a reference oscillator having same characteristics as the first oscillator, a reference AC signal to a reference resonance circuit that has same impedance as a predetermined first state of states that the first resonance circuit can have;
receiving, by a determination circuit, the first electric signal that is formed in the first resonance circuit by an influence of the first AC signal;
receiving, by the determination circuit, a reference electric signal that is formed in the reference resonance circuit; and
determining, by the determination circuit, a displacement of the first part and the external force in the Z-axis direction based on the first resonant frequency of the first electric signal and a reference resonant frequency of the reference electric signal.

15. The method of claim 14, wherein the determining the external force in the Z-axis direction comprises:
detecting a difference between the reference resonant frequency and the first resonant frequency; and
obtaining quantified sensing information about an extent to which the first resonance circuit deviates from the first state, the displacement of the first part relative to the inductive coil, and the external force in the Z-axis direction based on the difference between the reference resonant frequency and the first resonant frequency.

16. The method of claim 14, further comprising recognizing, by the determination circuit, quantified sensing information about the external force in the Z-axis direction in a channel area corresponding to the inductive coil and a user gesture intended by the external force in the Z-axis direction based on a change pattern of a difference between the reference resonant frequency and the first resonant frequency in a time domain.

17. A method of operating an inductive force sensor, the inductive force sensor comprising a second part including a plurality of separated areas configured to be exposed to an external force in a Z-axis direction and to be elastically deformable along the Z-axis direction by the external force in the Z-axis direction and a plurality of inductive coils formed on a substrate that is spaced apart from the second part and disposed to correspond to the plurality of separated areas and to face the plurality of separated areas respectively, the method comprising:
applying, by a first oscillator, a first AC signal to a first channel resonance circuit coupled to a first inductive coil of the plurality of inductive coils and configured to generate a first electric signal having a first resonant frequency attributable to first inductance formed in the first inductive coil based on a first displacement of a first separated area relative to the first inductive coil;
applying, by a second oscillator, a second AC signal to a second channel resonance circuit coupled to a second inductive coil of the plurality of inductive coils and configured to have a second resonant frequency attributable to second inductance formed in the second inductive coil based on a second displacement of a second separated area relative to the second inductive coil;
applying, by a reference oscillator configured to have same characteristics as the first and second oscillators, a reference AC signal to a reference resonance circuit configured to have same impedance as a predetermined first state of states that the first channel resonance circuit has and a predetermined second state of states that the second channel resonance circuit has;
receiving, by a determination circuit, the first electric signal formed in the first channel resonance circuit;
receiving, by the determination circuit, a second electric signal formed in the second channel resonance circuit;
receiving, by the determination circuit, a reference electric signal formed in the reference resonance circuit; and
determining, by the determination circuit, the first displacement, the second displacement, a location at which the external force in the Z-axis direction has been input, and the external force based on the first resonant frequency of the first electric signal, the second resonant frequency of the second electric signal, and a reference resonant frequency of the reference electric signal.

18. The method of claim 17, wherein the determining, by the determination circuit, a location at which the external force in the Z-axis direction has been input and the external force comprises:
detecting a difference between the reference resonant frequency and the first resonant frequency;
detecting a difference between the reference resonant frequency and the second resonant frequency;
obtaining quantified sensing information about an extent to which the first resonance circuit deviates from the first state, the first displacement of the first separated area, and the external force in the Z-axis direction appearing in the first separated area corresponding to the first inductive coil based on the difference between the reference resonant frequency and the first resonant frequency; and obtaining quantified sensing information about an extent to which the second resonance circuit deviates from the second state, the second displacement of the second separated area, and the external force in the Z-axis direction appearing in the second separated area corresponding to the second inductive coil based on the difference between the reference resonant frequency and the second resonant frequency.

19. An electronic device comprising:
an enclosure configured to surround an interior of the electronic device;
a first area disposed on the enclosure, and configured to operate as a power-on button;
a plurality of second areas arranged to be elastically deformable in a Z-axis direction by an external force applied in the Z-axis direction in remaining areas of the enclosure excluding the first area;
a pressure-sensing variable resistor disposed in the first area, and configured to respond to pressure from an outside;
a power-on button on/off sensing circuit connected to the pressure-sensing variable resistor and an internal power of the electronic device;
a plurality of inductive coils formed on a substrate that is spaced apart from the plurality of second areas inside the electronic device, and disposed to be opposite to the plurality of second areas, respectively;
a plurality of individual channel resonance circuits coupled to the plurality of inductive coils, respectively, and configured to have individual channel resonant frequencies attributable to individual channel inductances formed in the plurality of inductive coils based on individual channel displacements of the plurality of second areas in the Z-axis direction relative to the plurality of inductive coils;
a reference resonant circuit configured to have a same impedance as a predetermined first state of states that the plurality of individual channel resonant circuits has; and a determination circuit configured to:
receive a reference electric signal formed in the reference resonance circuit by an influence of a reference AC signal applied to the reference resonance circuit and a plurality of individual channel electric signals formed in the plurality of individual channel resonance circuits by an influence of individual channel AC signals applied to the plurality of individual channel resonance circuits; and
determine the individual channel displacements, locations at which external forces applied in the Z-axis direction have been input in the plurality of second areas and the external forces applied in the Z-axis direction based on a reference resonant frequency of the reference electric signal and individual channel resonant frequencies of the plurality of individual channel electric signals.

20. The electronic device of claim 19, wherein when a change in a resistance value of the pressure-sensing variable resistor attributable to pressure on the first area from the outside is equal to or larger than a first threshold value, the power-on button on/off sensing circuit performs control so that the internal power is applied to the plurality of inductive coils, the plurality of individual channel resonance circuits, the reference resonance circuit, and the determination circuit.

21. The electronic device of claim 19, wherein the determination circuit obtains quantified sensing information about extents to which the plurality of individual channel resonance circuits deviates from the first state, individual channel displacements of the plurality of second areas in the Z-axis direction, and external forces applied to the plurality of second areas in the Z-axis direction based on extents to which individual channel resonant frequencies of the plurality of the individual channel resonance circuits deviate from the reference resonant frequency.

* * * * *